US012653011B2

(12) United States Patent
Luo et al.

(10) Patent No.: US 12,653,011 B2
(45) Date of Patent: Jun. 9, 2026

(54) MICROELECTRONIC DEVICES INCLUDING STAIRCASE STRUCTURES AND, MERGED SOURCE TIER STRUCTURES, AND RELATED MEMORY DEVICES AND ELECTRONIC SYSTEMS

(71) Applicant: Micron Technology, Inc., Boise, ID (US)

(72) Inventors: Shuangqiang Luo, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 714 days.

(21) Appl. No.: 18/057,478

(22) Filed: Nov. 21, 2022

(65) Prior Publication Data

US 2023/0207470 A1 Jun. 29, 2023

Related U.S. Application Data

(60) Provisional application No. 63/294,607, filed on Dec. 29, 2021.

(51) Int. Cl.
*H01L 23/535* (2006.01)
*H01L 23/528* (2006.01)
(Continued)

(52) U.S. Cl.
CPC ........ *H01L 23/535* (2013.01); *H01L 23/5283* (2013.01); *H10B 41/27* (2023.02);
(Continued)

(58) Field of Classification Search
CPC ........ H10B 41/27; H10B 41/41; H10B 43/27; H10B 43/40; H10B 41/10; H10B 41/50; H10B 43/10; H10B 43/50; H01L 23/535; H01L 23/5283; H01L 21/76838; H01L 21/76877
See application file for complete search history.

(56) References Cited

U.S. PATENT DOCUMENTS 10,580,795 B1 * 3/2020 Luo ........................ H10B 43/10
2021/0126009 A1 * 4/2021 Luo ........................ H10B 43/35
(Continued)

*Primary Examiner* — Galina G Yushina
(74) *Attorney, Agent, or Firm* — TraskBritt

(57) ABSTRACT

A microelectronic device is disclosed, comprising: a stack structure comprising vertically alternating conductive structures and insulating structures arranged in tiers, each of the tiers individually comprising one of the conductive structures and one of the insulating structures, the stack structure having blocks separated from one another by filled slot structures; a source tier structure underlying the stack structure and comprising: a merged conductive structure adjacent a first discrete conductive structure in a first direction; and a second discrete conductive structure in the first direction that is spaced apart from the merged conductive structure by the first discrete conductive structure; a first support contact structure on the first discrete conductive structure; and a subsequent support contact structure on the merged conductive structure and adjacent the first support contact structure in the first direction, wherein one of the filled slot structures is vertically directly above at least a portion of the merged conductive structure.

10 Claims, 16 Drawing Sheets

(51) Int. Cl.

| | | |
|---|---|---|
| *H10B 41/27* | (2023.01) | |
| *H10B 41/41* | (2023.01) | |
| *H10B 43/27* | (2023.01) | |
| *H10B 43/40* | (2023.01) | |

(52) U.S. Cl.
CPC ............. *H10B 41/41* (2023.02); *H10B 43/27* (2023.02); *H10B 43/40* (2023.02)

(56) References Cited

U.S. PATENT DOCUMENTS

| | | | |
|---|---|---|---|
| 2021/0193574 A1* | 6/2021 | Sun ........................ | H01L 21/311 |
| 2021/0265371 A1* | 8/2021 | Luo ........................ | H10B 43/10 |
| 2021/0296342 A1* | 9/2021 | Luo ........................ | H10B 41/27 |
| 2021/0391257 A1* | 12/2021 | Nguyen ................ | H10B 41/35 |

* cited by examiner

MICROELECTRONIC DEVICES INCLUDING STAIRCASE STRUCTURES AND, MERGED SOURCE TIER STRUCTURES, AND RELATED MEMORY DEVICES AND ELECTRONIC SYSTEMS

CROSS-REFERENCE TO RELATED APPLICATION

This application claims the benefit under 35 U.S.C. § 119(e) of U.S. Provisional Patent Application Ser. No. 63/294,607, filed Dec. 29, 2021, the disclosure of which is hereby incorporated herein in its entirety by this reference.

TECHNICAL FIELD

The disclosure, in various embodiments, relates generally to the field of integrated circuit device design and fabrication. More specifically, the disclosure relates to microelectronic devices including staircase structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

Unfortunately, conventional methods of forming a memory device, such as a NAND Flash memory device, can result in undesirable damage to the memory devices, such as one or more of undesirable walk-off of formed features relative to additional features thereunder, undesirable lift-off (e.g., delamination) of features relative to additional features thereunder, and undesirable damage (e.g., corrosion-based damage) to features during the formation of additional features thereover.

DETAILED DESCRIPTION

Figure 1:
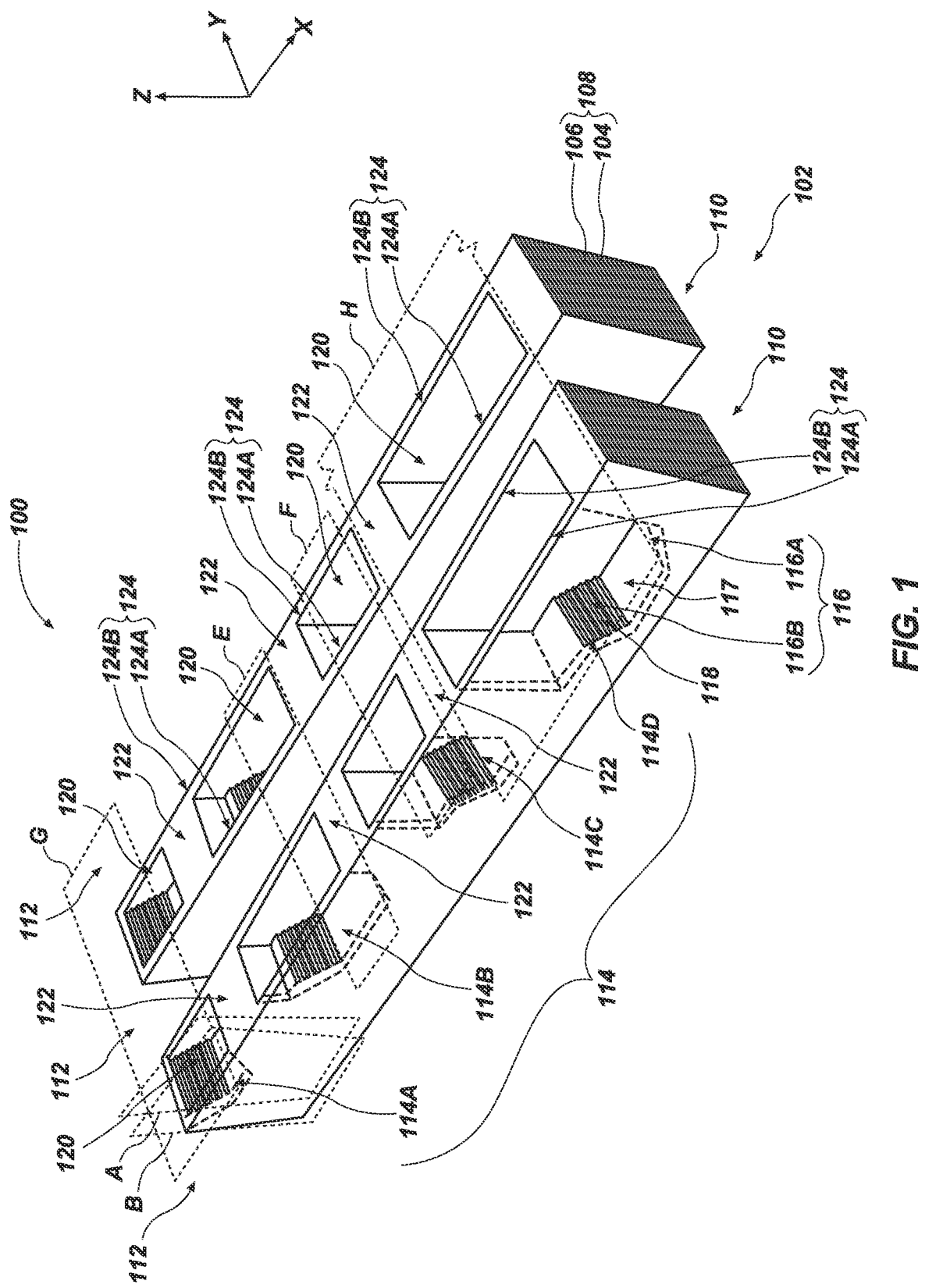
FIG. 1 is a simplified, partial perspective view of a microelectronic device structure 100, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as an SoC, including a processor alone, a memory alone, a processor and a memory, or an integrated-circuit device including logic and memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 is a simplified, partial perspective view of a microelectronic device structure 100, in accordance with embodiments of the disclosure. As shown in FIG. 1, the microelectronic device structure 100 may be formed to include a stack structure 102 including a vertically alternating (e.g., in a Z-direction) sequence of insulative material 104 and conductive material 106 arranged in tiers 108. Each of the tiers 108 of the stack structure 102 may individually include the conductive material 106 vertically neighboring (e.g., directly vertically adjacent) the insulative material 104. In addition, the stack structure 102 may be divided (e.g., segmented, partitioned) into blocks 110 separated from one another by filled slots 112. The filled slots 112 comprise slots (e.g., slits, trenches, openings) filled with insulative material. For clarity and ease of understanding the drawings and related description, the filled slots 112 are depicted as being unfilled in FIG. 1, but it will be understood that the filled slots 112 include insulative material within boundaries thereof. The filled slots 112 may vertically extend (e.g., in the Z-direction) substantially completely through the stack structure 102. The filled slots 112 may vertically extend (e.g., in the Z-direction) through the stack structure 102. Additional features (e.g., materials, structures) of the stack structure 102 (including the blocks 110 thereof) are described in further detail below.

The insulative structures 104 of the tiers 108 of the stack structure 102 may be formed of and include at least one insulative material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 104 is formed of and includes a dielectric oxide material, such as $SiO_x$ (e.g., $SiO_2$). Each of the insulative structures 104 may individually be substantially homogeneous, may be substantially heterogeneous. In some embodiments, each of the insulative structures 104 is substantially homogeneous. In further embodiments, at least one of the insulative structures 104 is substantially heterogeneous. One or more of the insulative structures 104 may, for example, be formed of and include a stack (e.g., laminate) of at least two different insulative materials.

The conductive structures 106 of the tiers 108 of the stack structure 102 may be formed of and include conductive material. By way of non-limiting example, the conductive structures 106 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 106 are formed of and include W. Each of the conductive structures 106 may individually be substantially homogeneous, or one or more of the conductive structures 106 may individually be substantially heterogeneous. In some embodiments, each of the conductive structures 106 is formed to be substantially homogeneous. In additional embodiments, each of the conductive structures 106 is formed to be heterogeneous. Each conductive structures 106 may, for example, be formed of and include a stack of at least two different conductive materials.

Optionally, one or more liner materials(s) (e.g., insulative liner material(s), conductive wiring material(s)) may also be formed around the conductive structures 106. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 106. In some embodiments, the liner material(s) comprise titanium nitride. In further embodiments, the liner material(s) further include aluminum oxide. As a non-limiting example, aluminum oxide may be formed directly adjacent the insulative structures 104, titanium nitride may be formed directly adjacent the aluminum oxide, and tungsten may be formed directly adjacent the titanium nitride. For clarity and ease of understanding the description, the liner material(s) are not illustrated in FIG. 1, but it will be understood that the liner material(s) may be disposed around the conductive structures 106.

The stack structure 102 may be formed to include any desired number of the tiers 108. By way of non-limiting example, the stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

Still referring to FIG. 1, the blocks 110 of the stack structure 102 may horizontally extend parallel in an X-direction (e.g., a first horizontal direction). As used herein, the term "parallel" means substantially parallel. Horizontally neighboring blocks 110 of the stack structure 102 may be separated from one another in a Y-direction (e.g., a second horizontal direction) orthogonal to the X-direction by the filled slots 112, and finally by the dielectric-filled slot structures 112 (see, e.g., FIG. 2B). The filled slots 112 may also horizontally extend parallel in the X-direction. Each of the blocks 110 of the stack structure 102 may exhibit substantially the same geometric configuration (e.g., substantially the same dimensions and substantially the same shape) as each other of the blocks 110, or one or more of the blocks 110 may exhibit a different geometric configuration (e.g., one or more different dimensions and/or a different shape) than one or more other of the blocks 110. In addition, each pair of horizontally neighboring blocks 110 of the stack structure 102 may be horizontally separated from one another by substantially the same distance (e.g., corresponding to a width in the Y-direction of each of the filled slots 112) as each other pair of horizontally neighboring blocks 110 of the stack structure 102, or at least one pair of horizontally neighboring blocks 110 of the stack structure 102 may be horizontally separated from one another by a different distance than that separating at least one other pair of horizontally neighboring blocks 110 of the stack structure 102. In some embodiments, the blocks 110 of the stack structure 102 are substantially uniformly (e.g., substantially non-variably, substantially equally, substantially consistently) sized, shaped, and spaced relative to one another.

As shown in FIG. 1, the blocks 110 of the stack structure 102 may individually include stadium structures 114, crest regions 122 (e.g., elevated regions), and bridge regions 124 (e.g., additional elevated regions). Each of the blocks 110 may individually include some of the stadium structures 114 distributed throughout and substantially confined within a horizontal area thereof. Each of the stadium structures 114 may include a filled trench 120 thereover. Within each of the blocks 110, the crest regions 122 may be horizontally interposed between stadium structures 114 horizontally neighboring one another in the X-direction. In addition, within each of the blocks 110, the bridge regions 124 may horizontally neighbor opposing sides of individual stadium structures 114 in the Y-direction, and may horizontally extend from and between crest regions 122 horizontally neighboring one another in the X-direction. In FIG. 1, for clarity and ease of understanding the drawings and associated description, portions (e.g., some of the bridge regions 124 horizontally neighboring first sides of the stadium structures 114 in the Y-direction) of one of the blocks 110 of the stack structure 102 are depicted as transparent to more clearly show the stadium structures 114 distributed within each of the blocks 110.

Still referring to FIG. 1, at least some (e.g., each) of the stadium structures 114 within an individual block 110 of the stack structure 102 may be positioned at different vertical elevations in the Z-direction than one another. For example, as depicted in FIG. 1, an individual block 110 may include a first stadium structure 114A, a second stadium structure 114B at a relatively lower vertical position (e.g., in the Z-direction) within the block 110 than the first stadium structure 114A, a third stadium structure 114C at a relatively lower vertical position within the block 110 than the second stadium structure 114B, and a fourth stadium structure 114D at a relatively lower vertical position within the block 110 than the third stadium structure 114C. In addition, stadium structures 114 may be substantially uniformly (e.g., equally, evenly) horizontally spaced apart from one another. In additional embodiments, one or more blocks 110 of the stack structure 102 may individually include a different quantity of stadium structures 114 and/or a different distribution of stadium structures 114 than that depicted in FIG. 1. For example, an individual block 110 of the stack structure 102 may include greater than four (4) of the stadium structures 114 (e.g., greater than or equal to five (5) of the stadium structures 114, greater than or equal to ten (10) of the stadium structures 114, greater than or equal to twenty-five (25) of the stadium structures 114, greater than or equal to fifty (50) of stadium structures 114), or less than four (4) of the stadium structures 114 (e.g., less than or equal to three (3) of the stadium structures 114, less than or equal to two (2) of the stadium structures 114, only one (1) of the stadium structures 114). As another example, within an individual block 110, stadium structures 114 may be at least partially non-uniformly (e.g., non-equally, non-evenly) horizontally spaced, such that at least one of the stadium structures 114 is separated from at least two other of the stadium structures 114 horizontally neighboring (e.g., in the X-direction) the at least one stadium structures 114 by different (e.g., non-equal) distances. As an additional non-limiting example, within an individual block 110, vertical positions (e.g., in the Z-direction) of the stadium structures 114 may vary in a different manner (e.g., may alternate between relatively deeper and relatively shallower vertical positions) than that depicted in FIG. 1.

Each stadium structure 114 may include opposing staircase structures 116, and a central region 117 horizontally interposed between (e.g., in the X-direction) the opposing staircase structures 116. The opposing staircase structures 116 of each stadium structure 114 may include a forward staircase structure 116A and a reverse staircase structure 116B. A phantom line extending from a top of the forward staircase structure 116A to a bottom of the forward staircase structure 116A may have a positive slope, and another phantom line extending from a top of the reverse staircase structure 116B to a bottom of the reverse staircase structure 116B may have a negative slope. In additional embodiments, one or more of the stadium structure 114 may individually exhibit a different configuration than that depicted in FIG. 1. As a non-limiting example, at least one stadium structures 114 may be modified to include a forward staircase structure 116A but not a reverse staircase structure 116B (e.g., the reverse staircase structure 116B may be absent), or at least one stadium structure 114 may be modified to include a reverse staircase structure 116B but not a forward staircase structure 116A (e.g., the forward staircase structure 116A may be absent). In such embodiments, the central region 117 horizontally neighbors a bottom of the forward staircase structure 116A (e.g., if the reverse staircase structure 116B is absent), or horizontally neighbors a bottom of the reverse staircase structure 116B (e.g., if the forward staircase structure 116A is absent).

The opposing staircase structures 116 (e.g., the forward staircase structure 116A and the reverse staircase structure 116B) of an individual stadium structure 114 each include steps 118 defined by edges (e.g., horizontal ends) of the tiers 108 of the stack structure 102 within a horizontal area of an individual block 110 of the stack structure 102. For the opposing staircase structures 116 of an individual stadium structure 114, each step 118 of the forward staircase structure 116A may have a counterpart step 118 within the reverse staircase structure 116B having substantially the same geometric configuration (e.g., shape, dimensions), vertical position (e.g., in the Z-direction), and horizontal distance (e.g., in the X-direction) from a horizontal center (e.g., in the X-direction) of the central region 117 of the stadium structure 114. In additional embodiments, at least one step 118 of the forward staircase structure 116A does not have a counterpart step 118 within the reverse staircase structure 116B having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114; and/or at least one step 118 of the reverse staircase structure 116B does not have a counterpart step 118 within the forward staircase structure 116A having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114.

Each of the stadium structures 114 within an individual block 110 of the stack structure 102 may individually include a desired quantity of steps 118. Each of the stadium structures 114 may include substantially the same quantity of steps 118 as each other of the stadium structures 114, or at least one of the stadium structures 114 may include a different quantity of steps 118 than at least one other of the stadium structures 114. In some embodiments, at least one of the stadium structures 114 includes a different (e.g., greater, lower) quantity of steps 118 than at least one other of the stadium structures 114. As shown in FIG. 1, in some embodiments, the steps 118 of each of the stadium structures 114 are arranged in order, such that steps 118 directly horizontally adjacent (e.g., in the X-direction) one another correspond to tiers 108 of the stack structure 102 directly vertically adjacent (e.g., in the Z-direction) one another. In additional embodiments, the steps 118 of at least one of the stadium structures 114 are arranged out of order, such that at least some steps 118 of the stadium structure 114 directly horizontally adjacent (e.g., in the X-direction) one another correspond to tiers 108 of stack structure 102 not directly vertically adjacent (e.g., in the Z-direction) one another.

With continued reference to FIG. 1, for an individual stadium structure 114, the central region 117 thereof may horizontally intervene (e.g., in the X-direction) between and separate the forward staircase structure 116A thereof from the reverse staircase structure 116B thereof. The central region 117 may horizontally neighbor a vertically lowermost step 118 of the forward staircase structure 116A, and may also horizontally neighbor a vertically lowermost step 118 of the reverse staircase structure 116B. The central region 117 of an individual stadium structure 114 may have any desired horizontal dimensions. In addition, within an individual block 110 of the stack structure 102, the central region 117 of each of the stadium structures 114 may have substantially the same horizontal dimensions as the central region 117 of each other of the stadium structures 114, or the central region 117 of at least one of the stadium structures 114 may have different horizontal dimensions than the central region 117 of at least one other of the stadium structures 114.

For each block 110 of the stack structure 102, each stadium structure 114 (including the forward staircase structure 116A, the reverse staircase structure 116B, and the central region 117 thereof) within the block 110 may individually partially define boundaries (e.g., horizontal boundaries, vertical boundaries) of the filled trench 120 vertically extending (e.g., in the Z-direction) through the block 110. The crest regions 122 and the bridge regions 124 horizontally neighboring an individual stadium structure 114 may also partially define the boundaries of the filled trench 120 associated with the stadium structure 114. The filled trench 120 may only vertically extend through tiers 108 of the stack structure 102 defining the forward staircase structure 116A and the reverse staircase structure 116B of the stadium structure 114; or may also vertically extend through additional tiers 108 of the stack structure 102 not defining the forward staircase structure 116A and the reverse staircase structure 116B of the stadium structure 114, such as additional tiers 108 of the stack structure 102 vertically overlying the stadium structure 114. Edges of the additional tiers 108 of the stack structure 102 may, for example, define one or more additional stadium structures vertically overlying and horizontally offset from the stadium structure 114. The filled trench 120 may be filled with one or more dielectric materials, as described in further detail below with reference to FIGS. 2A and 2B.

Still referring to FIG. 1, for each block 110 of the stack structure 102, the crest regions 122 (which may also be referred to as "elevated regions" or "plateau regions") and the bridge regions 124 (which may also be referred to as "additional elevated regions" or "additional plateau regions") thereof may comprise portions of the stack structure 102 horizontally neighboring the stadium structures 114, the filled trenches 120, and the filled slots 112. Within each block 110, the crest regions 122 and the bridge regions 124 thereof may define uppermost boundaries of the stack structure 102.

As shown in FIG. 1, the crest regions 122 of an individual block 110 of the stack structure 102 may intervene between and separate stadium structures 114 horizontally neighboring one another in the X-direction. For example, one of the crest regions 122 may intervene between and separate the first stadium structure 114A and the second stadium structure 114B; an additional one of the crest regions 122 may intervene between and separate the second stadium structure 114B and the third stadium structure 114C; and a further one of the crest regions 122 may intervene between and separate the third stadium structure 114C and the fourth stadium structure 114D. A vertical height of the crest regions 122 in the Z-direction may be substantially equal to a maximum vertical height of the block 110 in the Z-direction; and a horizontal width of the crest regions 122 in the Y-direction may be substantially equal to a maximum horizontal width of the block 110 in the Y-direction. In addition, each of the crest regions 122 may individually exhibit a desired horizontal length in the X-direction. Each of the crest regions 122 of an individual block 110 of the stack structure 102 may exhibit substantially the same horizontal length in the X-direction as each other of the crest regions 122 of the block 110; or at least one of the crest regions 122 of the block 110 may exhibit a different horizontal length in the X-direction than at least one other of the crest regions 122 of the block 110.

As shown in FIG. 1, the bridge regions 124 of an individual block 110 of the stack structure 102 may intervene between and separate the stadium structures 114 of the block 110 from the filled slots 112 horizontally neighboring the block 110 in the Y-direction. For example, for each stadium structure 114 within an individual block 110 of the stack structure 102, a first bridge region 124A may be horizontally interposed in the Y-direction between a first side of the stadium structure 114 and a first of the filled slots 112 horizontally neighboring the block 110; and a second bridge region 124B may be horizontally interposed in the Y-direction between a second side of the stadium structure 114 and a second of the filled slots 112 horizontally neighboring the block 110. The first bridge region 124A and the second bridge region 124B may horizontally extend in parallel in the X-direction. In addition, the first bridge region 124A and the second bridge region 124B may each horizontally extend from and between crest regions 122 of the block 110 horizontally neighboring one another in the X-direction. The bridge regions 124 of the block 110 may be integral and continuous with the crest regions 122 of the block 110. Upper boundaries (e.g., upper surfaces) of the bridge regions 124 may be substantially coplanar with upper boundaries of the crest regions 122. A vertical height of the bridge regions 124 in the Z-direction may be substantially equal to a maximum vertical height of the block 110 in the Z-direction. In addition, each of the bridge regions 124 (including each first bridge region 124A and each second bridge region 124B) may individually exhibit a desired horizontal width in the Y-direction and a desired horizontal length in the X-direction. Each of the bridge regions 124 of the block 110 may exhibit substantially the same horizontal length in the X-direction as each other of the bridge regions 124 of the block 110; or at least one of the bridge regions 124 of the block 110 may exhibit a different horizontal length in the X-direction than at least one other of the bridge regions 124 of the block 110. In addition, each of the bridge regions 124 of the block 110 may exhibit substantially the same horizontal width in the Y-direction as each other of the bridge regions 124 of the block 110; or at least one of the bridge regions 124 of the block 110 may exhibit a different horizontal width in the Y-direction than at least one other of the bridge regions 124 of the block 110.

For each block 110 of the stack structure 102, the bridge regions 124 thereof horizontally extend around the filled trenches 120 of the block 110, as least some of the bridge regions 124 of the block 110 may be employed to form continuous conductive paths extending from and between horizontally neighboring crest regions 122 of the block 110.

Additional, non-limiting features of the microelectronic device structure 100 are described below with reference to FIGS. 2A through 7.

Figure 2A:
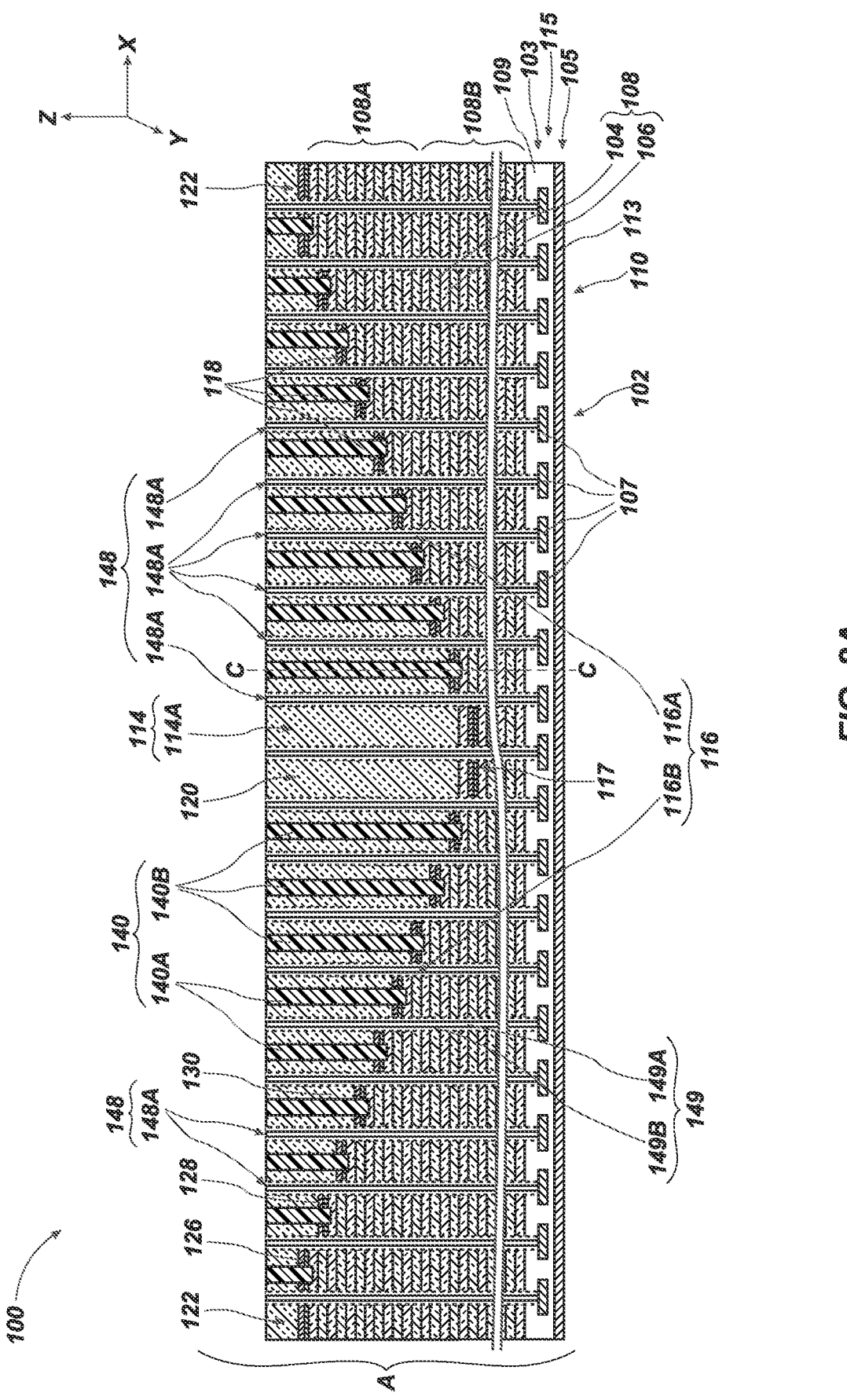
FIGS. 2A and 2B are simplified, longitudinal cross-section elevation views of the microelectronic device structure at a first staircase elevation after the processing stage depicted in FIG. 1.
Figure 2B:
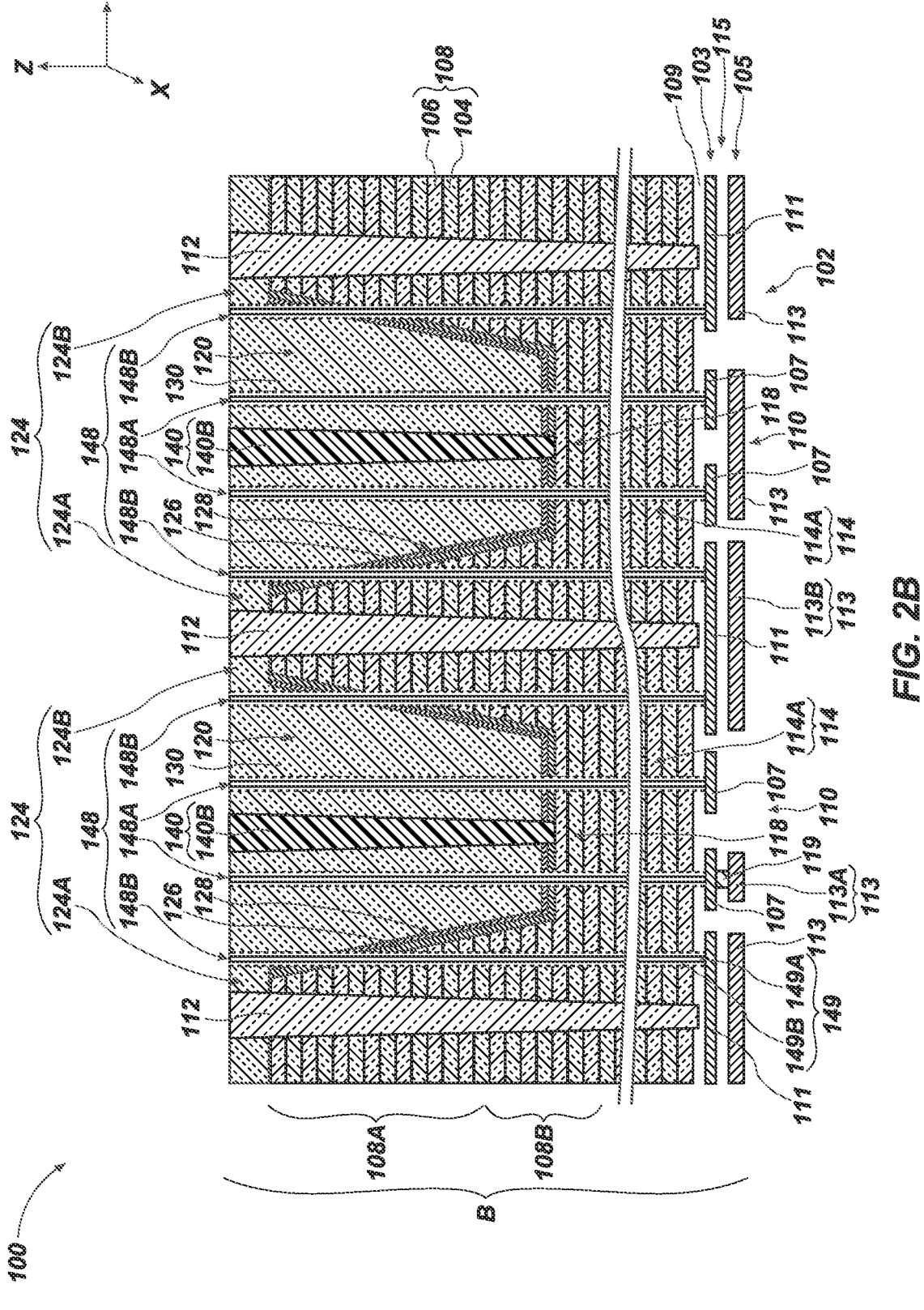

FIG. 2A depicts a simplified, longitudinal cross-sectional view of a portion A (identified with a dashed box in FIG. 1) of the microelectronic device structure 100 shown in FIG. 1. FIG. 2B is a simplified, longitudinal cross-sectional view of the microelectronic device structure 100 about the dashed line C-C illustrated in FIG. 2A. FIGS. 2A and 2B depict features of the microelectronic device structure 100 omitted from FIG. 1 for clarity and ease of understanding the drawings and related description. Such features, as well as additional features of the microelectronic device structure 100, are described in further detail below. First contact structures 148A are projected into FIG. 2A from a different X-Z plane than that of a portion B depicted in FIG. 1. The X-Z plane associated with the portion B depicted in FIG. 1 also includes at least the intersected part of the discrete conductive structures 107 depicted in FIG. 2A, where the first contact structures 148A contact the discrete conductive structures 107.

Within each block 110 of the stack structure 102, the conductive material 106 of one or more relatively vertically higher tier(s) 108A (e.g., upper tiers) may be employed to form upper select gate structures (e.g., drain side select gate (SGD) structures) for upper select transistors (e.g., drain side select transistors) of the block 110, as described in further detail below. The conductive material 106 of the relatively vertically higher tier(s) 108A may be segmented by one or more filled slot(s) (e.g., filled SGD slot(s)) to form the upper select gate structures of the block 110, as also described in further detail below. In some embodiments, within each block 110 of the stack structure 102, the conductive material 106 of each of less than or equal to eight (8) relatively vertically higher tier(s) 108A (e.g., from one (1) relatively vertically higher tier 108A to eight (8) relatively vertically higher tiers 108A) of the stack structure 102 is employed to form upper select gate structures (e.g., SGD structures) for the block 110. In addition, within each block 110 of the stack structure 102, the conductive material 106 of at least some relatively vertically lower tiers 108B vertically underlying the relatively vertically higher tier(s) 108A may be employed to form access line structures (e.g., word line structures) of the block 110, as also described in further detail below. Moreover, within each block 110 of the stack structure 102, the conductive material 106 of at least a vertically lowest tier 108 may be employed to form as at least one lower select gate structure (e.g., at least one source side select gate (SGS) structure) for lower select transistors (e.g., source side select transistors) of the block 110, as also described in further detail below.

As shown in FIG. 2A, the filled trenches 120 may individually be filled with multiple (e.g., more than one) dielectric materials, such as a first dielectric material 126 (e.g., a dielectric liner material), a second dielectric material 128 (e.g., an additional dielectric liner material), and a third dielectric material 130 (e.g., a dielectric fill material). For an individual filled trench 120, the first dielectric material 126 may be formed on or over surfaces (e.g., horizontally extending surfaces, vertically extending surfaces) of the stadium structure 114 (e.g., the first stadium structure 114A), the crest regions 122, and the bridge regions 124 (FIG. 1) of the block 110 (FIG. 1) defining boundaries (e.g., horizontal boundaries, vertical boundaries) of the filled trench 120; the second dielectric material 128 may be formed on or over the first dielectric material 126; and the third dielectric material 130 may be formed on or over the second dielectric material 128. As depicted in FIG. 2A, one or more (e.g., each) of the first dielectric material 126, the second dielectric material 128, and the third dielectric material 130 may also be formed to extend beyond boundaries (e.g., horizontal boundaries, vertical boundaries) of the filled trenches 120. For example, first dielectric material 126, the second dielectric material 128, and the third dielectric material 130 may also be formed to extend over uppermost surfaces of the crest regions 122 and/or the bridge regions 124 (FIG. 1) of individual blocks 110 (FIG. 1) of the stack structure 102 (FIG. 1) of the microelectronic device structure 100. In additional embodiments, the first dielectric material 126 and the second dielectric material 128 may be omitted (e.g., absent).

The first dielectric material 126 and the third dielectric material 130 may individually be formed of and include at least one dielectric material having different etch selectivity than the second dielectric material 128. The first dielectric material 126 and the third dielectric material 130 may, for example, have etch selectively substantially similar to that of the insulative material 104 of the tiers 108 of the stack structure 102. In some embodiments, the first dielectric material 126 and the third dielectric material 130 are formed of and include $SiO_x$ (e.g., $SiO_2$), and the second dielectric material 128 is formed of and includes $SiN_y$ (e.g., $Si_3N_4$).

Still referring to FIG. 2A, within a horizontal area of each stadium structure 114, groups of additional contact structures 140 may vertically extend through each of the third dielectric material 130, the second dielectric material 128, and the first dielectric material 126; and may land on (e.g., physically contact) at least some of the steps 118 of the stadium structure 114. The additional contact structures 140 may be formed of and include conductive material. As a non-limiting example, the additional contact structures 140 may be formed of and include one or more of at least one metal, at least one alloy, and at least one conductive metal-containing material (e.g., a conductive metal nitride, a conductive metal silicide, a conductive metal carbide, a conductive metal oxide). A material composition of the additional contact structures 140 may be substantially the same as a material composition of the conductive material 106 of the tiers 108 of the stack structure 102, or the material composition of the additional contact structures 140 may be different than the material composition of the conductive material 106 of the tiers 108 of the stack structure 102. In some embodiments, the additional contact structures 140 are individually formed of and includes W. The additional contact structures 140 may individually be homogeneous, or the additional contact structures 140 may individually be heterogeneous. Each additional contact structure 140 may have an uppermost vertical boundary (e.g., an uppermost surface) substantially coplanar with an uppermost vertical boundary (e.g., an uppermost surface) of the third dielectric material 130, and a lowermost vertical boundary (e.g., a lowermost surface) vertically adjacent an uppermost vertical boundary (e.g., an uppermost surface) of the conductive material 106 of an individual tier 108 of the stack structure 102. Each additional contact structure 140 may individually contact (e.g., physically contact, electrically contact) the conductive material 106 of the individual tier 108 of the stack structure 102 at an individual step 118 of an individual stadium structure 114 of an individual block 110 of the stack structure 102.

As shown in FIG. 2A, within a horizontal area of the first stadium structure 114A (e.g., a vertically uppermost stadium structure 114) within an individual block 110 of the stack structure 102, the additional contact structure 140 may include first additional contact structures 140A and second additional contact structures 140B. Within horizontal boundaries of the block 110, the first additional contact structures 140A may vertically extend to and terminate at the relatively vertically higher tier(s) 108A of the stack structure 102, and the second additional contact structures 140B may vertically extend to and terminate at the relatively vertically lower tiers 108B of the stack structure 102. The first additional contact structures 140A may vertically extend to and physically contact upper select gate structures (e.g., SGD structures) of the block 110 formed by portions of the conductive material 106 of individual relatively vertically higher tier(s) 108A of the stack structure 102. The second additional contact structures 140B may vertically extend to and physically contact local access line structures of the block 110 formed by conductive material 106 of individual relatively vertically lower tiers 108B of the stack structure 102.

Referring to collectively FIGS. 2A and 2B, within horizontal areas of the blocks 110 (FIG. 2B), contact structures 148 vertically extend through the stack structure 102 and to or into a source tier 103 underlying the stack structure 102. As shown in FIG. 2A, within horizontal areas of the stadium structures 114, the contact structures 148 may horizontally alternate in the X-direction with the additional contact structures 140. In addition, as shown in FIG. 2B, some of the contact structures 148 may be horizontally offset in the Y-direction from the additional contact structures 140 most horizontally proximate thereto in the Y-direction. In FIGS. 2A and 2B, the out-of-plane nature of some of the contact structures 148 relative to the planes depicted in FIGS. 2A and 2B is identified by way of dashed lines surrounding the some of the contact structures 148. As shown in FIG. 2B, the contact structures 148 include first contact structures 148A and second contact structures 148B. The first contact structures 148A may vertically extend to and land on (e.g., physically contact) discrete conductive structures 107 within the source tier 103, and the second contact structures 148B may vertically extend to and land on merged conductive structures 111 within the source tier 103. The discrete conductive structures 107 are also referred to herein as "first conductive structures" and the merged conductive structures 111 are also referred to as "second conductive structures." The discrete conductive structures 107 may be confined within horizontal areas of the blocks 110, and the merged conductive structures 111 may horizontally overlap the filled slot structures 112 and the blocks 110. As depicted in FIG. 2B, the discrete conductive structures 107 have smaller horizontal dimensions than the merged conductive structures 111. Also as depicted in FIG. 2B, the discrete conductive structures 107 are horizontally interposed along a first direction (Y-direction) between horizontally neighboring pairs of the merged conductive structures 111.

The first contact structures 148A may be relatively more centrally positioned (e.g., in the Y-direction) within a horizontal area of an individual block 110 than the second contact structures 148B. Put another way, the second contact structures 148B may be positioned relatively more proximate (e.g., closer to) horizontal boundaries (e.g., a periphery) of the block 110 than the first contact structures 148A.

Within each of the blocks 110 of the stack structure 102, the contact structures 148 may be arranged in rows extending in the X-direction, and columns extending in the Y-direction. Each of the columns of the contact structures 148 may include four (4) of the contact structures 148. For example, each of the columns of the contact structures 148 may include two (2) of the first contact structures 148A and two (2) of the second contact structures 148B. The two (2) of the first contact structures 148A of an individual column may be positioned horizontally inward of the two (2) of the second contact structures 148B of the individual column. Put another way, within an individual column of the contact structures 148, two (2) of the second contact structures 148B may horizontally flank two (2) of the first contact structures 148A. In addition, the rows of the contact structures 148 may individually only include some of the first contact structures 148A (e.g., may be free of any second contact structures 148B), may individually only include some of the second contact structures 148B (e.g., may be free of any first contact structures 148A), or may include a combination of some of the first contact structures 148A and some of the second contact structures 148B. As described in further detail below, in some embodiments, first contact structures 148A within columns and rows of the contact structures 148 land on discrete conductive structures 107 within the source tier 103 of the microelectronic device structure 100; and second contact structures 148B within columns and rows of the contact structures 148 land on merged conductive structures 111 within the source tier 103 of the microelectronic device structure 100.

Each of the contact structures 148 (e.g., each of the first contact structures 148A, each of the second contact structures 148B) may be formed of and include a sequence of different materials 149, including fill material 149A, and liner material 149B substantially covering and surround side surfaces (e.g., sidewalls) of the fill material 149A. In some embodiments, the fill material 149A is formed of and includes conductive material (e.g., a metallic material, such as tungsten). In an additional embodiment, the fill material 149A is formed of and includes one or more of an insulative material and a semiconductor material. The liner material 149B is formed of and includes insulative material (e.g., dielectric oxide material, such as silicon oxide). If the fill material 149A is formed of and includes conductive material, the liner material 149B may electrically isolate the conductive material of the fill material 149A from the conductive material 106 of the tiers 108 of the stack structure 102. In some embodiments, the liner material 149B is formed of and includes dielectric oxide material (e.g., $SiO_x$, such as $SiO_2$). In additional embodiment, such as some embodiments wherein the fill material 149A is formed of and includes insulative material, the liner material 149B is omitted.

The fill material 149A of the support contact structure 148 extends vertically from an upper boundary of the third dielectric material 130 to the source tier 103. At least some of the first contact structures 148A and the second contact structures 148B (e.g., including the conductive material as the fill material 149A) may be formed to extend below an upper boundary of the source tier 103. For example, some of the first contact structures 148A and the second contact structures 148B may be configured to extend vertically (e.g., in the Z-direction) through the stack structure 102 and physically contact (e.g., land on) some of the structures within the source tier 103 to facilitate a predetermined function (e.g., an electrical interconnection function, a support function) of the first contact structures 148A and the second contact structures 148B. In other embodiments, the first contact structures 148A and the second contact structures 148B do not provide electrical interconnection and serve primarily (e.g., only) to provide support at least during replacement-gate method processing.

Still referring to FIG. 2B, the microelectronic device structure 100 further includes at least one conductive routing tier 105 (e.g., a metallization tier) underlying the source tier 103. The conductive routing tier 105 may include conductive routing structures 113.

One or more dielectric materials (e.g., one or more of at least one dielectric oxide material, at least one dielectric nitride material, at least one dielectric oxynitride material, at least one dielectric carboxynitride material, and amorphous carbon) may be horizontally interposed between conductive routing structures 113 of the conductive routing tier 105. The conductive routing tier 105 may be in electrical communication (e.g., by way of one or more conductive interconnect structures) with some of the features (e.g., some structures, such as some of the conductive structures) of the source tier 103, and may electrically connect the some of the features of the source tier 103 to other features of a microelectronic device (e.g., a memory device) including the microelectronic device structure 100, as described in further detail below. In turn, the conductive routing structures 113 of the conductive routing tier 105 may be electrically connected to additional structures and/or devices (e.g., back end of line (BEOL) devices; control logic devices, such as control logic devices including complementary metal-oxide-semiconductor (CMOS) circuitry) vertically underlying the source tier 103 of the microelectronic device structure 100. As illustrated, a conductive interconnect tier 115 may be employed to electrically connect one or more of the discrete conductive structures 107 to a first portion 113A of the conductive routing structures 113 of the source tier 103, such as with one or more conductive interconnect structures 119.

The source tier 103 includes the discrete conductive structures 107 (e.g., discrete conductive island structures, first conductive structures) horizontally separated (e.g., in the X-direction and in the Y-direction perpendicular to the X-direction) from one another, and the merged conductive structures 111 (extended conductive structures, second conductive structures, conductive structures having larger horizontal dimensions than the first conductive structures). The discrete conductive structures 107 and the merged conductive structures 111 may be located at substantially the same vertical position (e.g., in the Z-direction) within the microelectronic device structure 100 as one another. Dielectric material 109 may surround (e.g., horizontally surround, vertically surround) and be interposed between (e.g., in the X-direction and in the Y-direction) the discrete conductive structures 107 and the merged conductive structures 111. The dielectric material 109 may vertically overlie and vertically underlie the discrete conductive structures 107 and the merged conductive structures 111, and may also horizontally intervene between and separate horizontally neighboring discrete conductive structures 107 and the merged conductive structures 111. The dielectric material 109 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric material 109 comprises $SiO_2$.

The discrete conductive structures 107 and the merged conductive structures 111 of the source tier 103 may each individually be formed of and include conductive material, such as one or more of at least one metal (e.g., one or more of W, Ti, Mo, Nb, V, Hf, Ta, Cr, Zr, Fe, Ru, Os, Co, Rh, Ir, Ni, Pd, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, and a conductive metal carbide, a conductive metal oxide), and at least one conductively doped semiconductor material (e.g., one or more of conductively doped Si, conductively doped Ge, and conductively doped SiGe). In some embodiments, the discrete conductive structures 107 and the merged conductive structures 111 of the source tier 103 are formed of and include conductively doped polycrystalline silicon. Each of the discrete conductive structures 107 and each of the merged conductive structures 111 of the source tier 103 may be substantially homogeneous, or one or more the discrete conductive structures 107 and/or one or more of the merged conductive structures 111 may individually be heterogeneous. In some embodiments, the discrete conductive structures 107 and the merged conductive structures 111 of the source tier 103 have substantially the same material composition and the same material distribution as one another. For example, the discrete conductive structures 107 and the merged conductive structures 111 of the source tier 103 may be formed (e.g., substantially simultaneously formed) by patterning (e.g., using a predetermined reticle configuration) the same conductive material(s).

The discrete conductive structures 107 of the source tier 103 may each individually exhibit a desired geometric configuration (e.g., dimensions and shape) and horizontal spacing among and proximate the merged conductive structures 111. The geometric configurations and horizontal spacing of the discrete conductive structures 107 may be selected at least partially based on the configurations and positions of other features of the microelectronic device structure 100, such as the merged conductive structures 111 and the contact structures 148. In some embodiments, one or more (e.g., each) of the discrete conductive structures 107 exhibits a generally quadrilateral (e.g., generally rectangular, generally square) horizontal cross-sectional shape when viewed from a vertical perspective. Within a horizontal area of an individual block 110 of the stack structure 102, each of the discrete conductive structures 107 may exhibit substantially the same geometric configuration (e.g., the same dimensions and the same shape) and horizontal spacing (e.g., in the X-direction, in the Y-direction) as each other of the discrete conductive structures 107, or one or more of the discrete conductive structures 107 may exhibit a different geometric configuration (e.g., dimensions and/or a different shape) and/or different horizontal spacing (e.g., in the X-direction, in the Y-direction) than one or more other of the discrete conductive structures 107. In some embodiments, within a horizontal area of an individual block 110 of the stack structure 102, the discrete conductive structures 107 are at least partially non-uniformly spaced apart from one another. For example, at least some horizontally neighboring discrete conductive structures 107 may be spaced apart from one another by a different distance than at least some other horizontally neighboring discrete conductive structures 107. In additional embodiments, within a horizontal area of an individual block 110 of the stack structure 102, discrete conductive structures 107 are substantially uniformly spaced apart from one another.

The merged conductive structures 111 of the source tier 103 may individually exhibit relatively larger horizontal areas than individual discrete conductive structures 107 of the source tier 103. As used herein, the term "merged" in relation to the merged conductive structures 111 identifies that the merged conductive structures 111 comprise monolithic structures extending substantially continuously across a horizontal dimension (e.g., in the X-direction) occupied by a plurality (e.g., more than one) of the discrete conductive structures 107. Hence, as compared to the discrete conductive structures 107, the merged conductive structures 111 are unitary and continuous over a given horizontal dimension spanning multiple discrete conductive structures 107. In conventional configurations, discrete conductive structures corresponding, in shape and size, to some of the discrete conductive structures 107 were located at the positions of the merged conductive structures 111.

As shown in FIG. 2B, at least some (e.g., each) of the merged conductive structures 111 may individually horizontally overlap a horizontal area of a filled slot structure 112, and may also partially horizontally overlap horizontal areas of the blocks 110 horizontally neighboring (e.g., in the Y-direction) the filled slot structure 112.

Still referring to FIG. 2B, some of the discrete conductive structures 107 and at least some (e.g., each) of the merged conductive structures 111 of the source tier 103 may be electrically connected to at least some of the conductive routing structures 113 within the conductive routing tier 105. In addition, other of the discrete conductive structures 107, and, optionally, one or more merged conductive structures 111 of the source tier 103 may be electrically isolated from the conductive routing structures 113 within the conductive routing tier 105. For example, some of the discrete conductive structures 107 of the source tier 103 may be electrically connected (e.g., by way of vertically extending conductive interconnect structures, support structures) to some of the conductive routing structures 113 within the conductive routing tier 105.

Figure 2C:
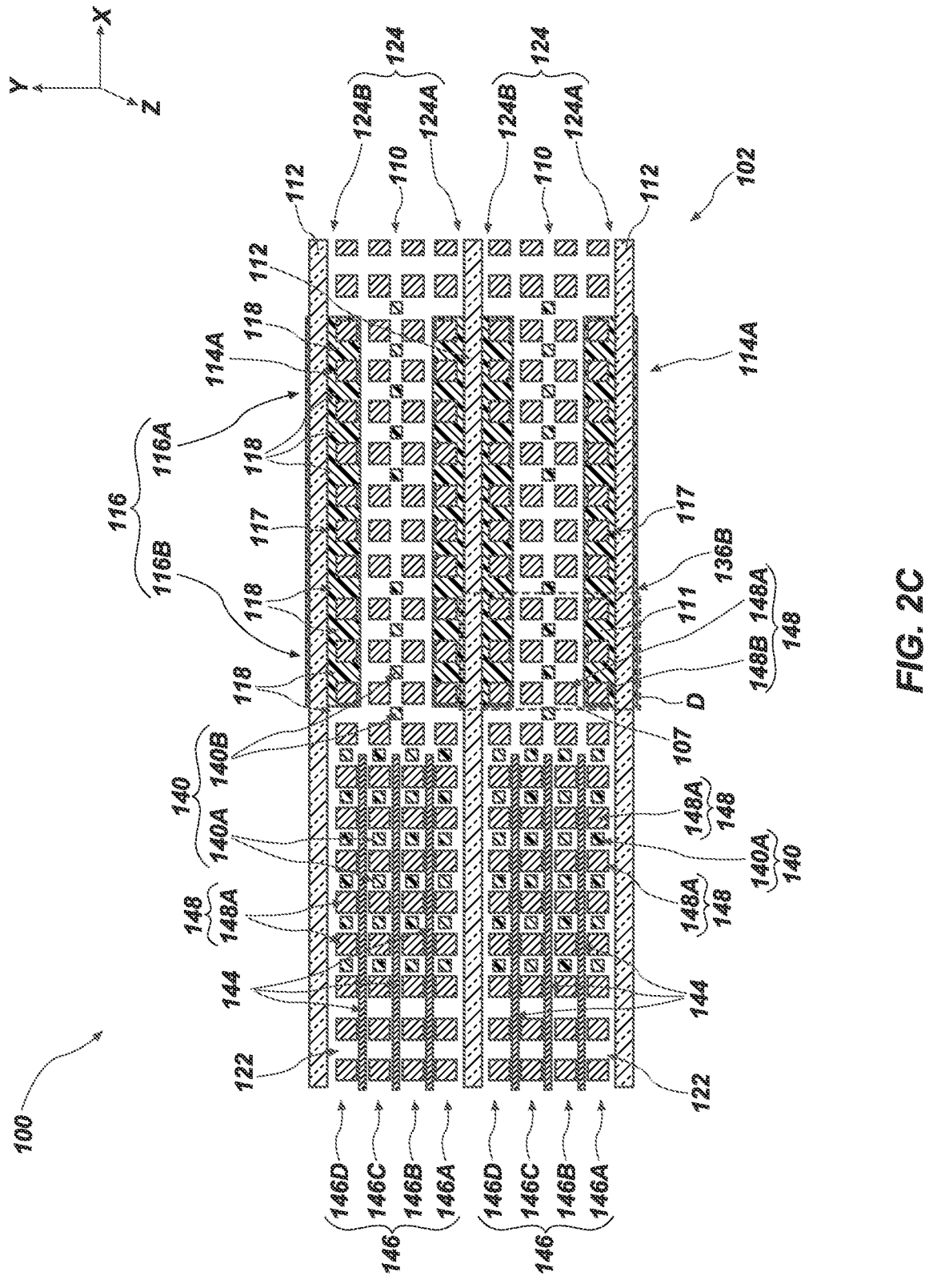
FIG. 2C is a simplified, partial top-down view of the microelectronic device structure 100 described with reference to FIGS. 2A and 2B.

FIG. 2C is a simplified, partial top-down view of a portion of the microelectronic device structure 100 described with reference to FIGS. 2A and 2B. The portion encompasses a horizontal area spanning the first stadium structures 114A of horizontally neighboring blocks 110 of the microelectronic device structure 100. As shown in FIG. 2C, in addition to the features (e.g., structures, materials) previously described with reference to FIGS. 2A and 2B, the microelectronic device structure 100 is formed to further include additional filled slot structures 144 (e.g., dielectric-filled slot structures). The additional filled slot structures 144 may be formed to vertically extend (e.g., in the Z-direction) partially through each block 110 of the stack structure 102, and may partially define and horizontally separate (e.g., in the Y-direction) upper select gate structures of each block 110 of the stack structure 102. Each of the additional filled slot structures 144 may vertically extend in the Z-direction to and terminate at or within vertical boundaries of a relatively lowest tier 108 of the relatively vertically higher tiers 108A (FIG. 2B) of the stack structure 102. In addition, within each block 110 of the stack structure 102, the additional filled slot structures 144 may horizontally extend in parallel in the X-direction into a horizontal area of the first stadium structure 114A within the block 110. The additional filled slot structures 144 may, for example, individually horizontally extend in the X-direction through a crest region 122 of the block 110 horizontally neighboring the first stadium structure 114A and partially into a horizontal area of one of the opposing staircases structures 116 (e.g., the reverse staircase structure 116B) of the first stadium structure 114A. In some embodiments, each of the additional filled slot structures 144 horizontally terminates (e.g., horizontally ends) in the X-direction at or proximate a relatively lowest step 118 of the one of the opposing staircase structures 116 (e.g., the reverse staircase structure 116B) within vertical boundaries (e.g., in the Z-direction) of the relatively vertically higher tiers 108A (e.g., FIG. 2B) of the stack structure 102.

Each additional filled slot structure 144 may comprise a slot (e.g., opening, trench, slit) in a block 110 of the stack structure 102 filled with at least one dielectric material. A material composition of the dielectric material of the additional filled slot structures 144 may be substantially the same as a material composition of the dielectric material of the filled slot structures 112, or the material composition of the dielectric material of the additional filled slot structures 144 may be different than the material composition of the dielectric material of the filled slot structures 112. In some embodiments, the additional filled slot structures 144 are formed of and include at least one dielectric oxide material (e.g., $SiO_x$, such as $SiO_2$).

Each block 110 of the stack structure 102 may include greater than or equal to one (1) of the additional filled slot structures 144 within a horizontal area thereof, such as greater than or equal to two (2) of the additional filled slot structures 144, or greater than or equal to three (3) of the additional filled slot structures 144. In some embodiments, each block 110 of the stack structure 102 includes three (3) of the additional filled slot structures 144 within a horizontal area thereof. The additional filled slot structures 144 may sub-divide each block 110 into at least two (2) sub-blocks 146. For example, as shown in FIG. 2C, if an individual block 110 includes three (3) of the additional filled slot structures 144 within a horizontal area thereof, the additional filled slot structures 144 may sub-divide the block 110 into four (4) sub-blocks 146, such as a first sub-block 146A, a second sub-block 146B, a third sub-block 146C, and a fourth sub-block 146D. For an individual block 110, portions of the conductive material 106 (FIGS. 4A and 4B) of each of the relatively vertically higher tiers 108A of the stack structure 102 within horizontal areas of the sub-blocks 146 of the block 110 may form upper select gate structures (e.g., SGD structures) of the block 110. For example, first portions of each of the relatively vertically higher tiers 108A (e.g., FIG. 2B) of the stack structure 102 within horizontal boundaries of the first sub-block 146A may form first upper select gate structures of the block 110; second portions of each of the relatively vertically higher tiers 108A of the stack structure 102 within horizontal boundaries of the second sub-block 146B may form second upper select gate structures of the block 110; third portions of each of the relatively vertically higher tiers 108A of the stack structure 102 within horizontal boundaries of the third sub-block 146C may form third upper select gate structures of the block 110; and fourth portions of each of the relatively vertically higher tiers 108A of the stack structure 102 within horizontal boundaries of the fourth sub-block 146D may form fourth upper select gate structures of the block 110.

As shown in FIG. 2C, each sub-block 146 of an individual block 110 of the stack structure 102 may individually include a row of the first additional contact structures 140A. For example, if an individual block 110 is formed to include four (4) sub-blocks 146 (e.g., the first sub-block 146A, the second sub-block 146B, the third sub-block 146C, and the fourth sub-block 146D), each of the four (4) sub-blocks 146 may include one (1) row of the first additional contact structures 140A within a horizontal area thereof, such that the block 110 includes four (4) rows of the first additional contact structures 140A. Each row of the first additional contact structures 140A may horizontally extend in the X-direction, and may individually include a portion of the first additional contact structures 140A provided within a horizontal area of the block 110. In additional embodiments wherein an individual block 110 is sub-divided into a different number of sub-blocks 146, the block 110 may include a different number of rows of the first additional contact structures 140A equal to the different number of sub-blocks 146. In addition, as depicted in FIG. 2C, within an individual block 110 of the stack structure 102, columns of the first additional contact structures 140A may horizontally extend in the Y-direction. Each column of the first additional contact structures 140A may include first additional contact structures 140A provided within different sub-blocks 146 of the block 110 than one another.

For each sub-block 146 of an individual block 110 of the stack structure 102, the first additional contact structures 140A with a horizontal area of the sub-block 146 may be provided at desired horizontal positions (e.g., in the X-direction and the Y-direction) on the steps 118 of the first stadium structure 114A.

Figure 2D:
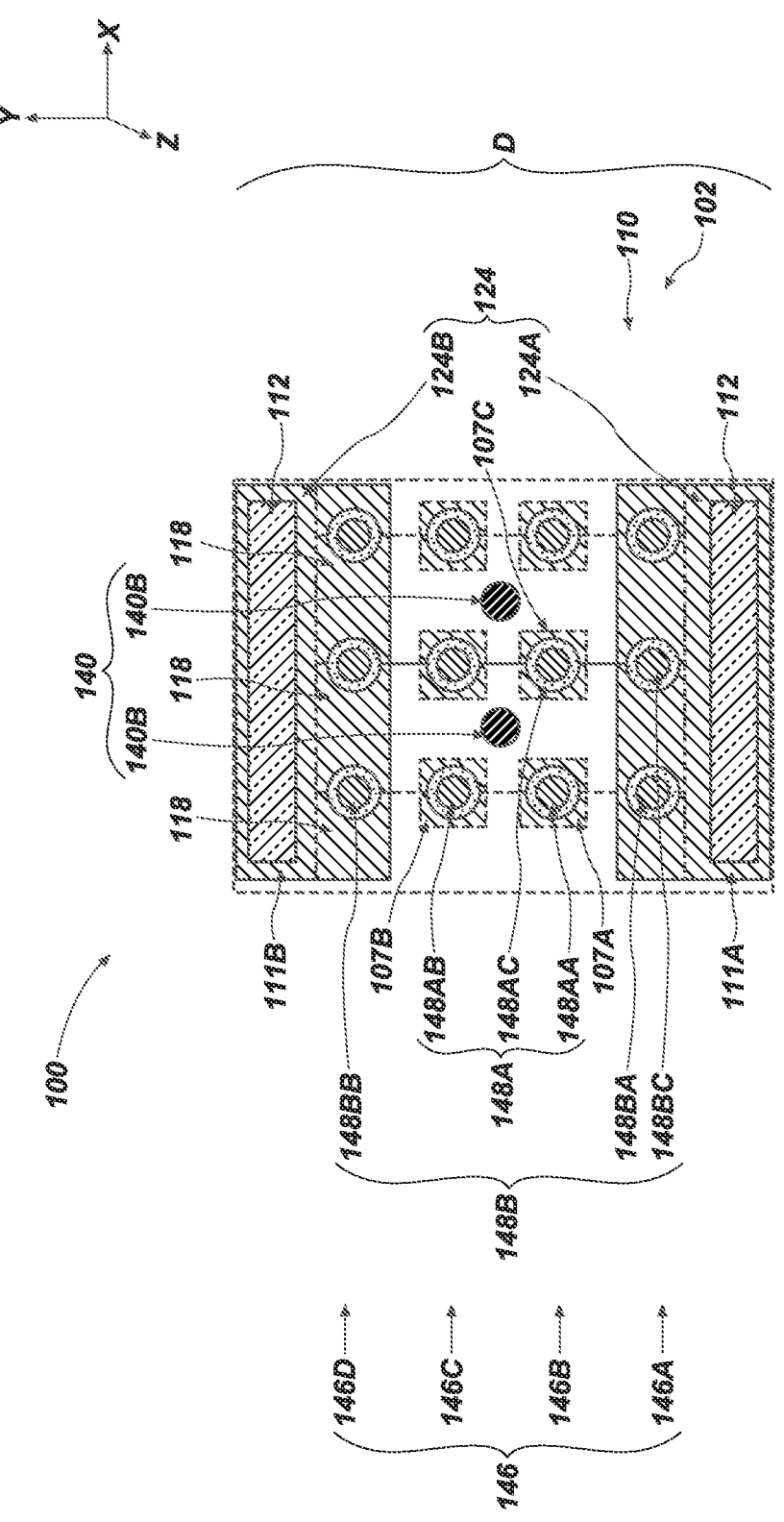
FIG. 2D shows a magnified view of a portion of the simplified, partial top-down view of the microelectronic device structure depicted in FIG. 2C.

FIG. 2D shows a magnified view of a portion D (identified with a dashed box in FIG. 2C) of the simplified, partial top-down view of the microelectronic device structure 100 depicted in FIG. 2C. As shown in FIG. 2D, in some embodiments, within an individual block 110 of the stack structure 102 (FIG. 2C), the merged conductive structures 111 vertically underlie the filled slot structures 112 as well as the second contact structures 148B. In addition, the first contact structures 148A horizontally neighboring the second contact structures 148B land on the discrete conductive structures 107.

The layout of structures illustrated in FIG. 2D define a feature arrangement that may be found in several locations within the microelectronic device structure 100. For example, the discrete conductive structures 107 may include a first primary conductive structure 107A, a first secondary conductive structure 107B, and a first tertiary conductive structure 107C; the first support contacts 148A may include a first primary support contact 148AA, a first secondary support contact 148AB, and first tertiary support contact 148AC structures; the second support contact structures 148B may include a second primary support contact 148BA, a second secondary support contact 148BB, and a second tertiary support contact 148BC structure; and the merged conductive structures 111 may include a first merged conductive structure 111A, and a second merged conductive structure 111B. The first contact structures 148A may contact discrete conductive structures 107, and the second contact structures 148B may contact the merged conductive structures 111.

Figure 3:
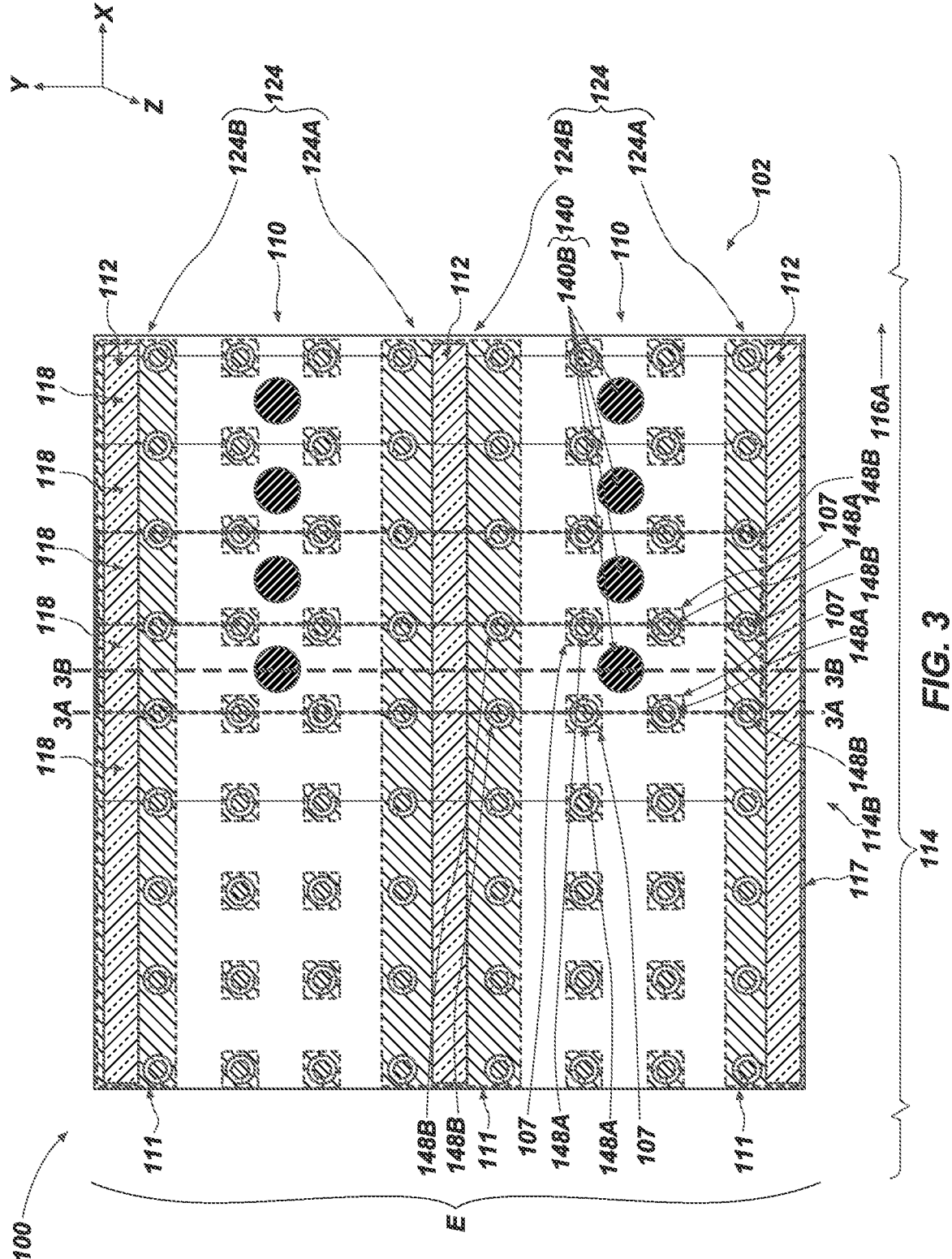
FIG. 3 is a simplified, partial top-down view of a portion of the microelectronic device structure shown in FIG. 1.

Referring next to FIG. 3, depicted is a simplified, partial top-down view of an additional portion E of the microelectronic device structure 100 shown in FIG. 1. For clarity and ease of understanding the drawings and related description, some features (e.g., portions of the stack structure 102 (FIG. 1), the third dielectric material 130 (FIG. 1)) of the microelectronic device structure 100 vertically overlying features (e.g., discrete conductive structures 107, merged conductive structures 111) the source tier 103 (FIG. 1) are omitted from FIG. 3. As shown in FIG. 3, the portion E encompasses a horizontal area spanning part of the second stadium structures 114B of horizontally neighboring blocks 110 of the microelectronic device structure 100. For example, the portion E encompasses parts of two (2) blocks 110 in the first direction (Y-direction), including parts (e.g., a central region 117, a portion of a forward staircase structure 116A) of the second stadium structures 114B within the parts of the two blocks 110.

As depicted in FIG. 3, the merged conductive structures 111 individually vertically underlie and horizontally overlap the individual filled slot structures 112, as well as some of the second contact structures 148B vertically extending through the blocks 110 horizontally neighboring the filled slot structures 112. In some embodiments, the merged conductive structures 111 are electrically coupled to additional features of a microelectronic device including the microelectronic device structure 100, and the second contact structures 148B in contact with the merged conductive structures 111 are employed to relay signals received from the additional features to further features of microelectronic device. Thus, the second contact structures 148B may be considered electrically active contact structures.

Still referring to FIG. 3, the discrete conductive structures 107 individually vertically underlie and horizontally overlap the first contact structures 148A. As shown in FIG. 3, four (4) first contact structures 148A in contact with four (4) discrete conductive structures 107 may horizontally neighbor each second additional contact structure 140B. The second additional contact structure 140B may be centrally horizontally positioned between the four (4) first contact structures 148A and the four (4) discrete conductive structures 107. In some embodiments, one or more of the discrete conductive structures 107 horizontally neighboring an individual second additional contact structure 140B are electrically coupled to additional features of a microelectronic device including the microelectronic device structure 100. In some such embodiments, one or more of the first contact structures 148A in contact with the one or more of the discrete conductive structures 107 are employed to relay signals received from the additional features to further features of the microelectronic device. Thus, the first contact structures 148A in contact with the discrete conductive structures 107 may be considered electrically active contact structures. In additional embodiments, the first contact structures 148A in contact with the discrete conductive structures 107 horizontally neighboring an individual second additional contact structure 140B, are not employed to relay signals received from additional features of a microelectronic device including the microelectronic device structure 100 to further features of the microelectronic device. Thus, where useful, the given first contact structures 148A in contact with the discrete conductive structures 107 may be considered electrically inactive contact structures.

Figure 3A:
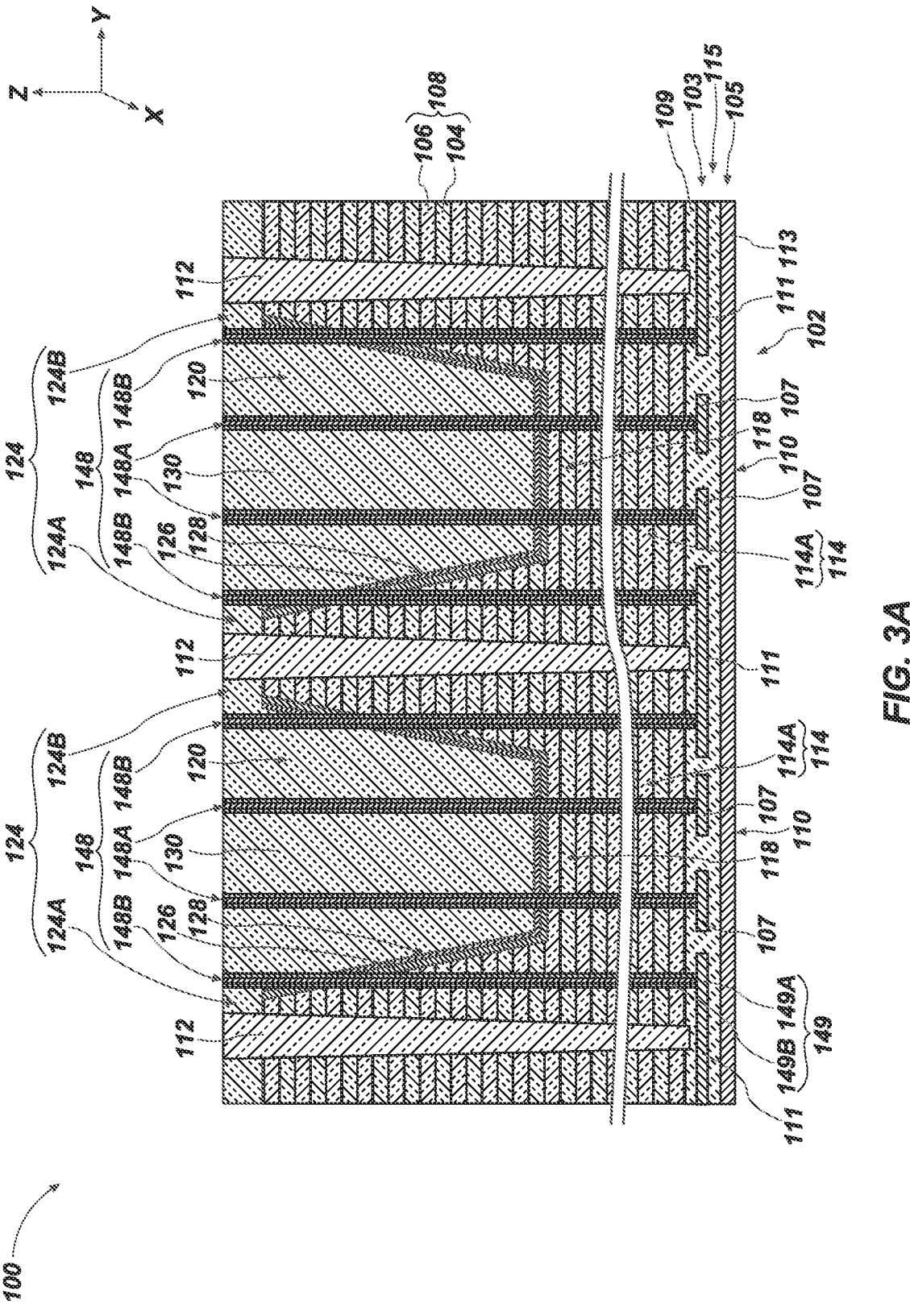
FIGS. 3A and 3B are simplified cross-section elevation views of different sections of the portion of the microelectronic device structure shown in FIG. 3.

FIG. 3A is a simplified, longitudinal cross-section elevation view of the additional portion E of the microelectronic device structure 100 shown in FIG. 3, about a dashed line 3A-3A illustrated in FIG. 3. As shown in FIG. 3A, within each block 110 of the stack structure 102, the bridge regions 124 (including the first bridge region 124A and the second bridge region 124B) of the block 110 may horizontally intervene in the first direction (Y-direction) between the stadium structures 114 (and, hence, the filled trenches 120) of the block 110 and the filled slot structures 112 horizontally neighboring the block 110 in the first direction (Y-direction).

Still referring to FIG. 3A, within an individual block 110 of the stack structure 102, a column of the contact structures 148 may include two (2) of the second contact structures 148B positioned proximate the filled slot structures 112 horizontally neighboring the block 110, and two (2) of the first contact structures 148A horizontally interposed (e.g., in the Y-direction) between the two (2) of the second contact structures 148B. The two (2) of the second contact structures 148B may vertically extend through the block 110 and to two (2) of the merged conductive structures 111 within the source tier 103. The two (2) of the first contact structures 148A may vertically extend through the block 110 and to two (2) of the discrete conductive structures 107 within the source tier 103. In addition, as depicted in FIG. 3A, at least some of the second contact structures 148B within horizontal neighboring pairs of the blocks 110 of the stack structure 102 may vertically extend to and physically contact (e.g., land on) an individual merged conductive structure 111 horizontally overlapping the horizontal neighboring pairs of the blocks 110. An individual merged conductive structure 111 may be shared by (e.g., common to) groups of the second contact structures 148B within each block 110 of a horizontal neighboring pair of the blocks 110.

Figure 3B:
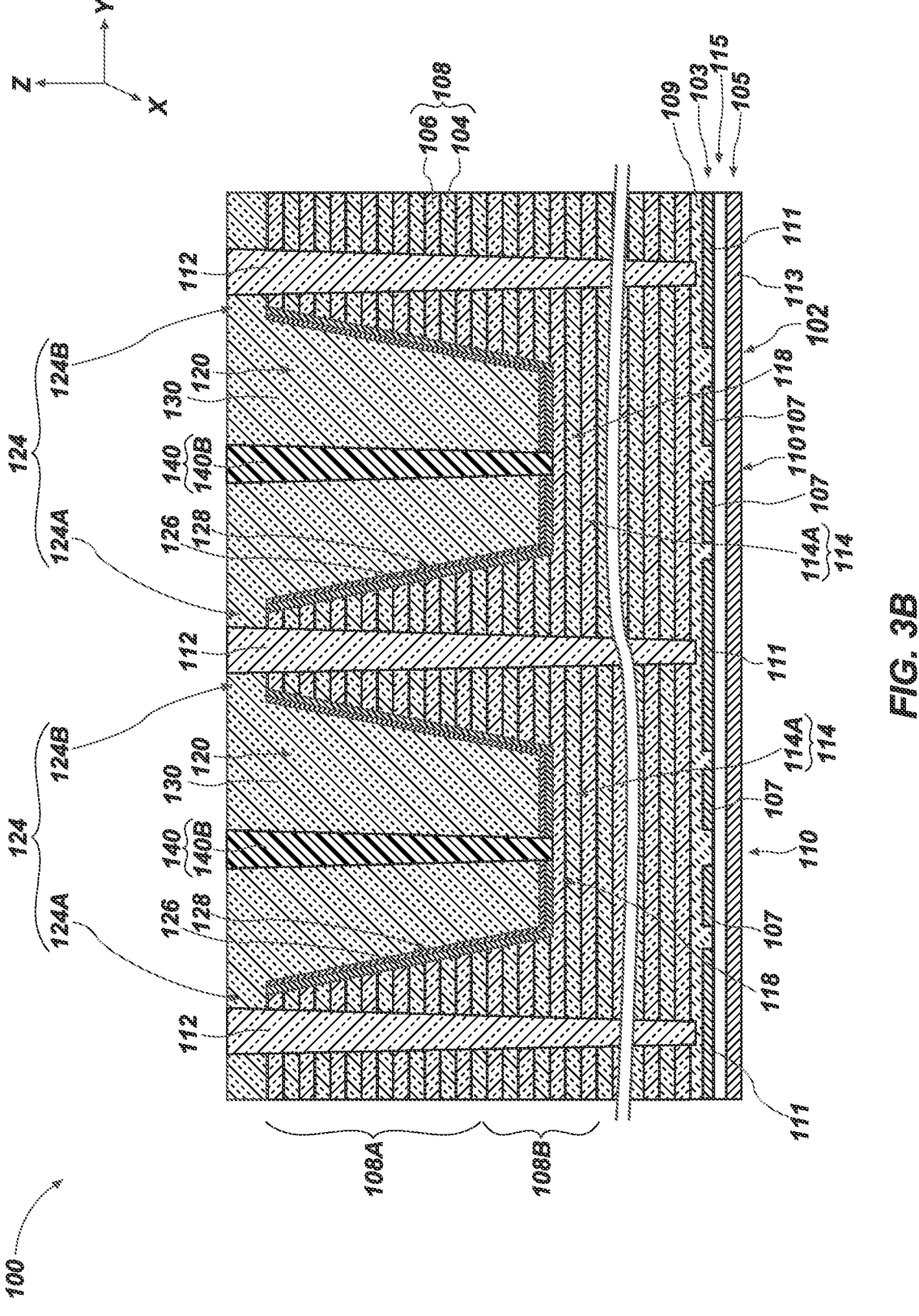

FIG. 3B is a simplified, longitudinal cross-section elevation view of the additional portion E of the microelectronic device structure 100 shown in FIG. 3, about a dashed line 3B-3B illustrated in FIG. 3. As shown in FIG. 3B, within individual blocks 110 of the stack structure 102, some of the second additional contact structures 140B may land on at least some of the steps 118 of an individual stadium structure 114 positioned within the vertically lower tiers 108B of the stack structure 102. In some embodiments, each of the second additional contact structures 140B is horizontally centered on an individual step 118 of the stadium structure 114 operatively associated therewith. In additional embodiments, at least one the second additional contact structures 140B is offset (e.g., in the X-direction, in the Y-direction) from a horizontal center of the step 118 of the stadium structure 114 operatively associated therewith.

Figure 4:
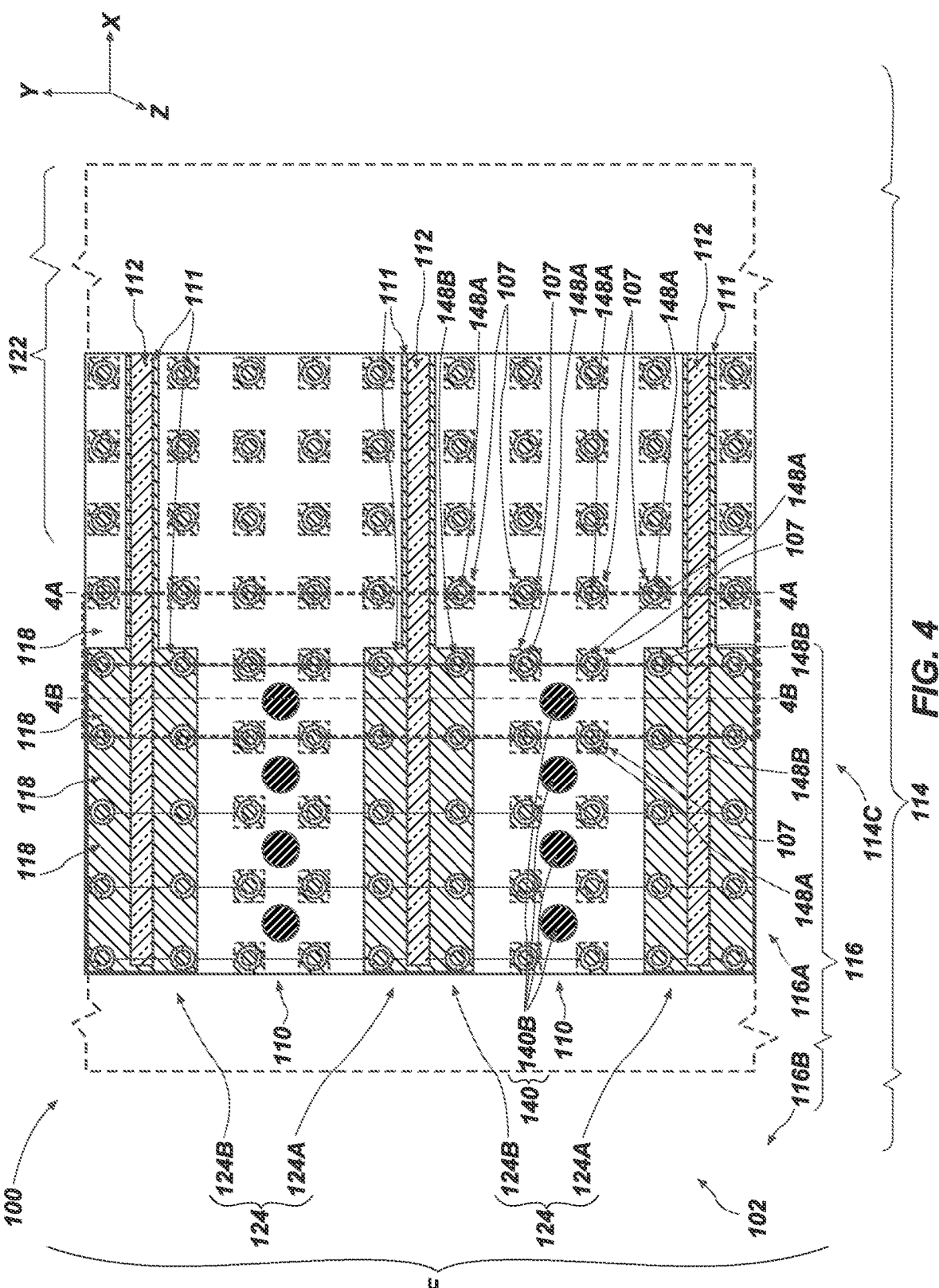
FIG. 4 is a simplified, partial top-down view of an additional portion of the microelectronic device structure shown in FIG. 1.

FIG. 4 is a simplified, partial top-down view of a further portion F of the microelectronic device structure 100 shown in FIG. 1. For clarity and ease of understanding the drawings and related description, some features (e.g., portions of the stack structure 102 (FIG. 1), the third dielectric material 130 (FIG. 1)) of the microelectronic device structure 100 vertically overlying features (e.g., discrete conductive structures 107, merged conductive structures 111 (second conductive structures 111)) the source tier 103 (FIG. 1) are omitted from FIG. 4. As shown in FIG. 4, for an individual block 110 of the stack structure 102, the portion F encompasses a transition between one of the staircase structures 116 (e.g., a forward staircase structure 116A) of the third stadium structure 114C and one of the crest regions 122 horizontally neighboring the third stadium structure 114C. Similar configurations may be present at and proximate transitions between the staircase structures 116 of relatively lower stadium structures 114 (e.g., the fourth stadium structure 114D) and the crest regions 122 horizontally most proximate thereto.

As depicted in FIG. 4, at or proximate the transition between the staircase structure 116 of the third stadium structure 114C and the crest region 122, horizontal dimensions, in the Y-direction, of the merged conductive structures 111 may decrease (e.g., narrow). Thus, within the crest region 122 of an individual block 110 of the stack structure 102, a greater quantity of the discrete conductive structures 107 may horizontally intervene (e.g., in the Y-direction) between portions of horizontally neighboring merged conductive structures 111. For example, within the crest region 122 of an individual block 110 of the stack structure 102, columns of the discrete conductive structures 107 may individually include of four (4) of the discrete conductive structures 107 horizontally interposed between portions of the horizontally neighboring merged conductive structures 111. In contrast, within boundaries of the second stadium structure 114B (e.g., FIG. 3) of the individual block 110, columns of the discrete conductive structures 107 may individually include of two (2) of the discrete conductive structures 107 horizontally interposed between additional portions of the horizontally neighboring merged conductive structures 111. As shown in FIG. 4, given the reduced horizontal dimensions of the portions of the merged conductive structures 111 within the crest region 122, second contact structures 148B may be absent from the crest region 122. For example, within the boundaries of the crest region 122 each column of the contact structures 148 may only include first contact structures 148A in physical contact with the discrete conductive structures 107 of a column of the discrete conductive structures 107. Within the crest region 122 at least some (e.g., each) of the first contact structures 148A may be electrically active, such that the at least some of the first contact structures 148A are employed to relay signals received from additional features of a microelectronic device including the microelectronic device structure 100 to further features of the microelectronic device.

Figure 4A:
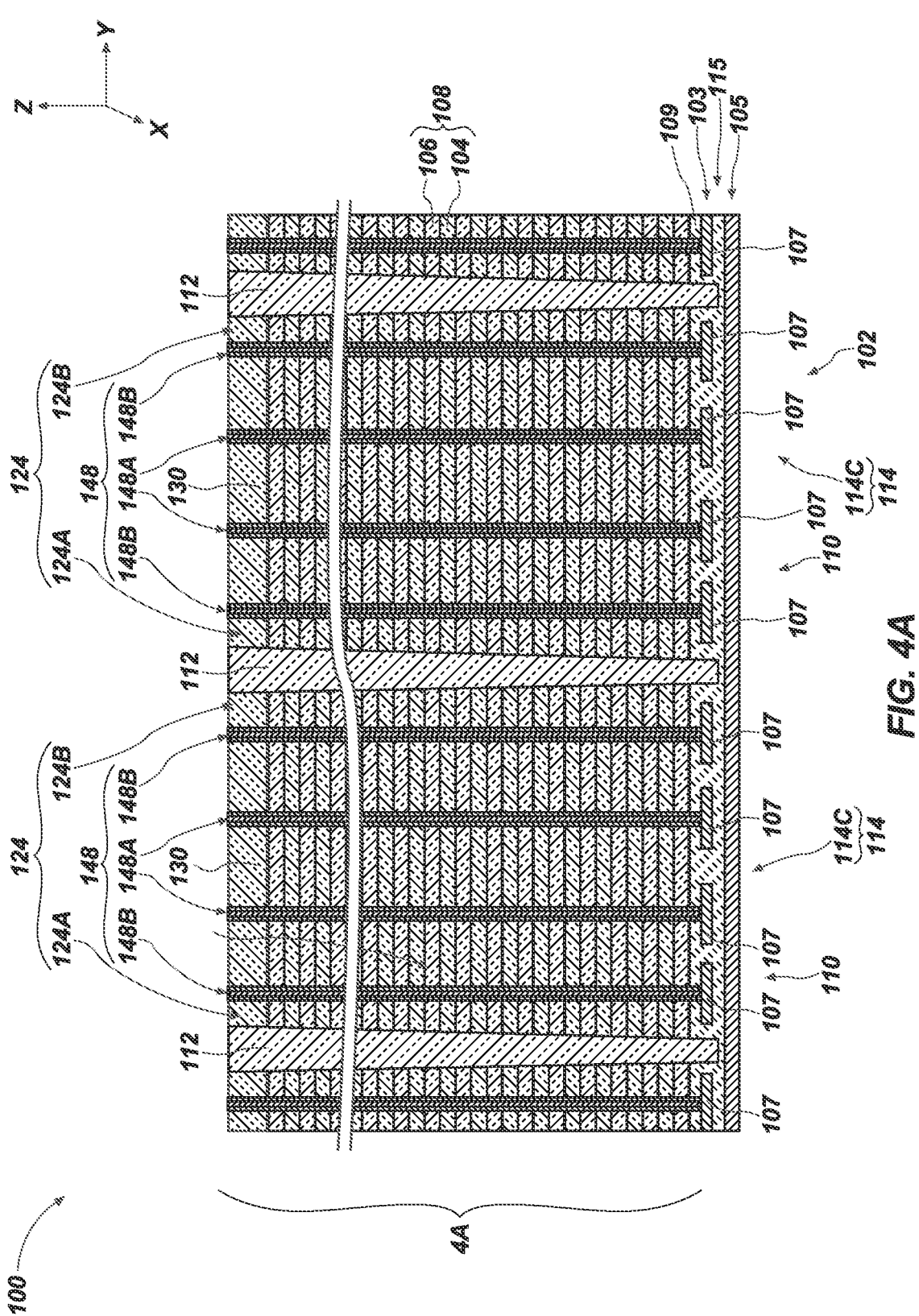
FIGS. 4A and 4B are simplified, longitudinal cross-section elevation views of different sections of the additional portion of the microelectronic device structure shown in FIG. 4.

FIG. 4A is a simplified, longitudinal cross-section elevation view of the further portion F of the microelectronic device structure 100 shown in FIG. 4, about a dashed line 4A-4A illustrated in FIG. 4. As shown in FIG. 4A, within an individual block 110 of the stack structure 102, a column of the contact structures 148 may include four (4) of the first contact structures 148A horizontally interposed (e.g., in the Y-direction) between two (2) of the filled slot structures 112 horizontally neighboring the block 110. The four (4) of the first contact structures 148A may vertically extend through the block 110 and to four (4) of the discrete conductive structures 107 within the source tier 103. As depicted in FIG. 4A, sections of the merged conductive structures 111 within the further portion F of the microelectronic device structure 100 may be free of second contact structures 148B (FIG. 4) within horizontal boundaries thereof.

Figure 4B:
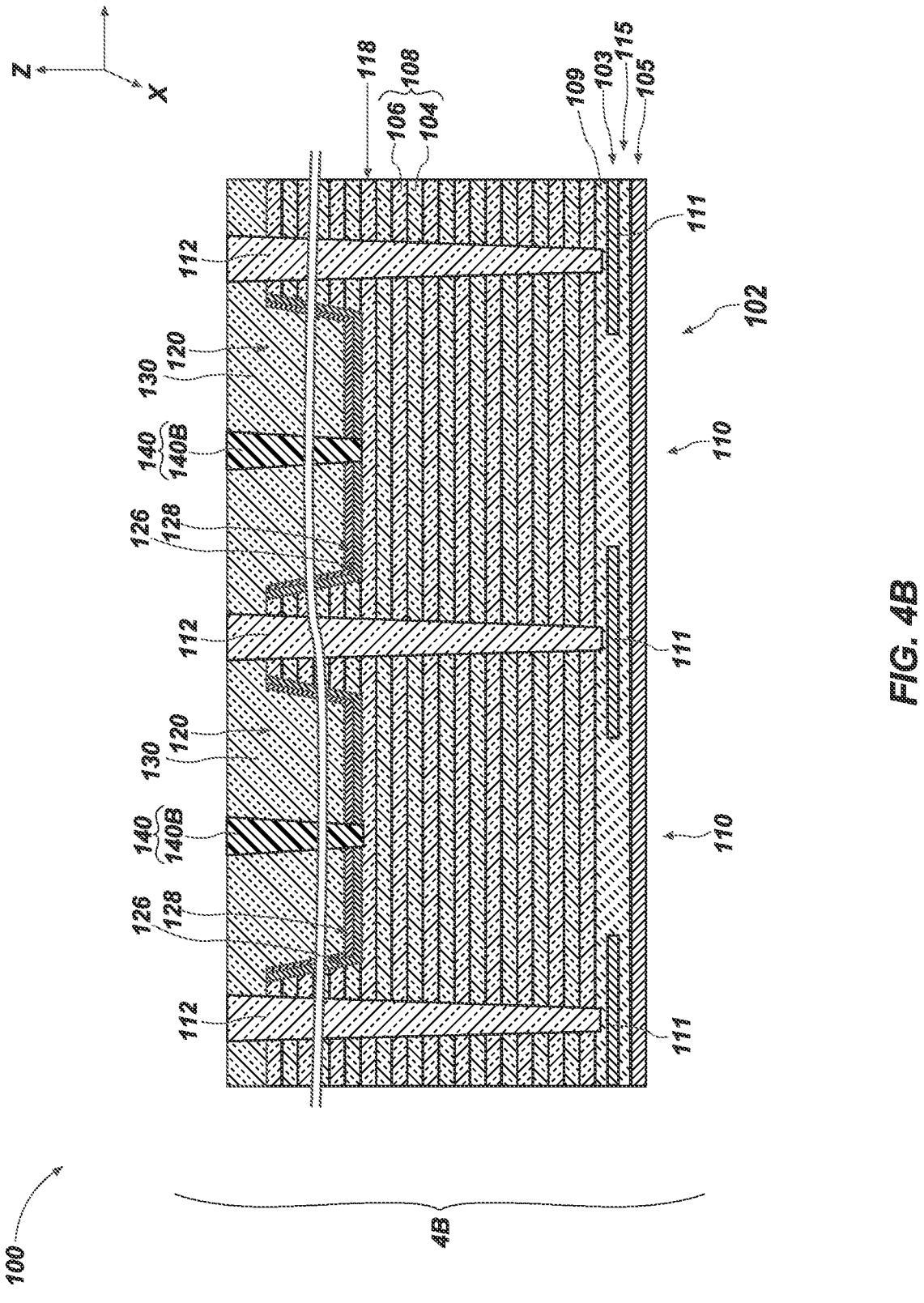

FIG. 4B is a simplified, longitudinal cross-section elevation view of the further portion F of the microelectronic device structure 100 shown in FIG. 4, about the dashed line 4B-4B illustrated in FIG. 4. As shown in FIG. 4B, within individual blocks 110 of the stack structure 102, some of the second additional contact structures 140B may land on at least some of the steps 118 of an individual stadium structure 114 (e.g., the third stadium structure 114C) of the stack structure 102. In some embodiments, each of the second additional contact structures 140B is horizontally centered on an individual step 118 of the stadium structure 114 operatively associated therewith. In additional embodiments, at least one the second additional contact structures 140B is offset (e.g., in the X-direction, in the Y-direction) from a horizontally center of the step 118 of the stadium structure 114 operatively associated therewith.

Figure 5:
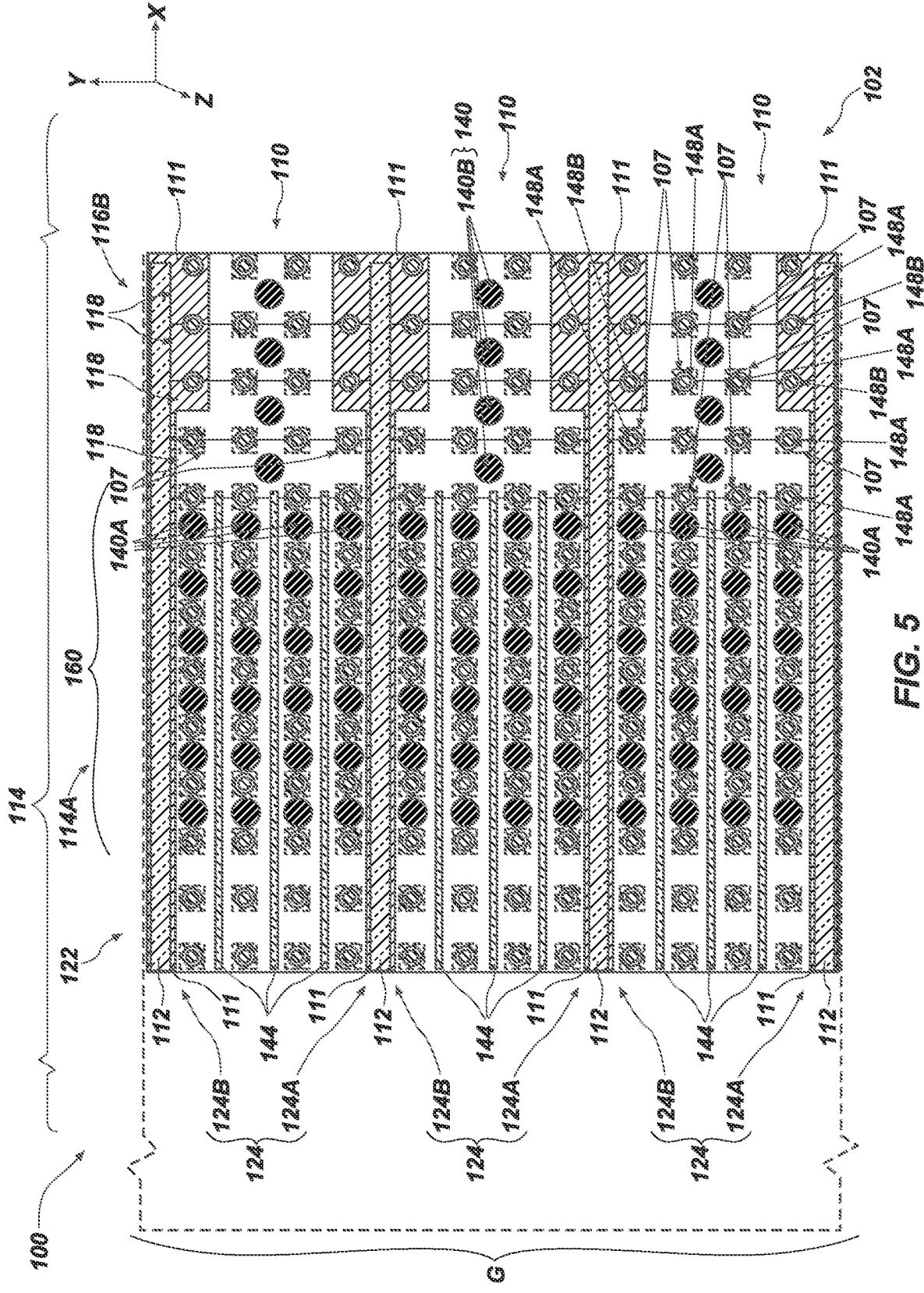
FIG. 5 is a simplified, partial top-down view of a further portion of the microelectronic device structure shown in FIG. 1.

FIG. 5 is a simplified, partial top-down view of a yet further portion G of the microelectronic device structure 100 shown in FIG. 1. For clarity and ease of understanding the drawings and related description, some features (e.g., portions of the stack structure 102 (FIG. 1), the third dielectric material 130 (FIG. 1)) of the microelectronic device structure 100 vertically overlying features (e.g., discrete conductive structures 107, merged conductive structures 111 (second conductive structures 111)) the source tier 103 (FIG. 1) are omitted from FIG. 5. As shown in FIG. 5, for an individual block 110 of the stack structure 102, the yet further portion G encompasses a transition between one of the staircase structures 116 (e.g., a reverse staircase structure 116B) of the first stadium structure 114A and one of the crest regions 122 horizontally neighboring the first stadium structure 114A, and also encompasses an SGD region 160 of the first stadium structure 114A wherein the conductive structures 106 (FIG. 1) of the tiers 108 (FIG. 1) are employed as selected gate structures.

As depicted in FIG. 5, within the SGD region 160 of the first stadium structure 114A, horizontal dimensions, in the Y-direction, of the merged conductive structures 111 may decrease (e.g., narrow) relative to non-SGD regions (e.g., access line regions) of the first stadium structure 114A. The horizontal dimensions of the merged conductive structures 111 within the SGD region 160 may be substantially equal to horizontal dimensions if the merged conductive structures 111 within the crest region 122 horizontally neighboring the first stadium structure 114A. Portions of the merged conductive structures 111 within the SGD region 160 of the first stadium structure 114A may be integral and continuous with additional portions of the merged conductive structures 111 within the crest region 122 and within non-SGD regions of the first stadium structure 114A.

Within boundaries of the SGD region 160 of the first stadium structure 114A, a greater quantity of the discrete conductive structures 107 may horizontally intervene (e.g., in the Y-direction) between portions of horizontally neighboring merged conductive structures 111 as compared to non-SGD regions of the first stadium structure 114A. For example, within the SGD region 160 of the first stadium structure 114A, columns of the discrete conductive structures 107 may individually include of four (4) of the discrete conductive structures 107 horizontally interposed between portions of the horizontally neighboring merged conductive structures 111. In contrast, as shown in FIG. 5, within boundaries of non-SGD regions of the first stadium structure 114, columns of the discrete conductive structures 107 may individually include of two (2) of the discrete conductive structures 107 horizontally interposed between additional portions of the horizontally neighboring merged conductive structures 111. As shown in FIG. 5, given the reduced horizontal dimensions of the portions of the merged conductive structures 111 within the SGD region 160, second contact structures 148B may be absent from the SGD region 160. For example, within the boundaries of the SGD region 160 each column of the contact structures 148 may only include first contact structures 148A in physical contact with the discrete conductive structures 107 of a column of the discrete conductive structures 107. Within the SGD region 160, at least some (e.g., each) of the first contact structures 148A may be electrically inactive, such that the at least some of the first contact structures 148A are not employed to relay signals received from additional features of a microelectronic device including the microelectronic device structure 100 to further features of the microelectronic device.

In an embodiment, an individual merged conductive structure 111 narrows in the first direction (Y-direction), and one of the first contact structures 148A horizontally neighbors the location of the transition to the relatively narrower horizontal dimension. This first contact structure 148A is horizontally interposed (in the X-direction) between one of the first contact structure 148A proximate a horizontal boundary of the SGD region 160 and one of the second contact structures 148B proximate a horizontal boundary of a relatively wider (in the Y-direction) portion of the merged conductive structure 111; and may be electrically inactive. Consequently, desired electrical properties are preserved, such as breakdown voltage (BV) of one of the first additional contact structures 140A most proximate the horizontal boundary of the SGD region 160. The narrowing of the merged conductive structure 111 may be referred to as a pullback region with respect to the SGD region 160. Within a column of the first contact structures 148A within the pullback region all of the first contact structures 148A may be electrically inactive. Similarly with this description of a pullback region, a column of first contact structures 148A may be electrically inactive in FIG. 4, along the dashed line 4A-4A.

Figure 6:
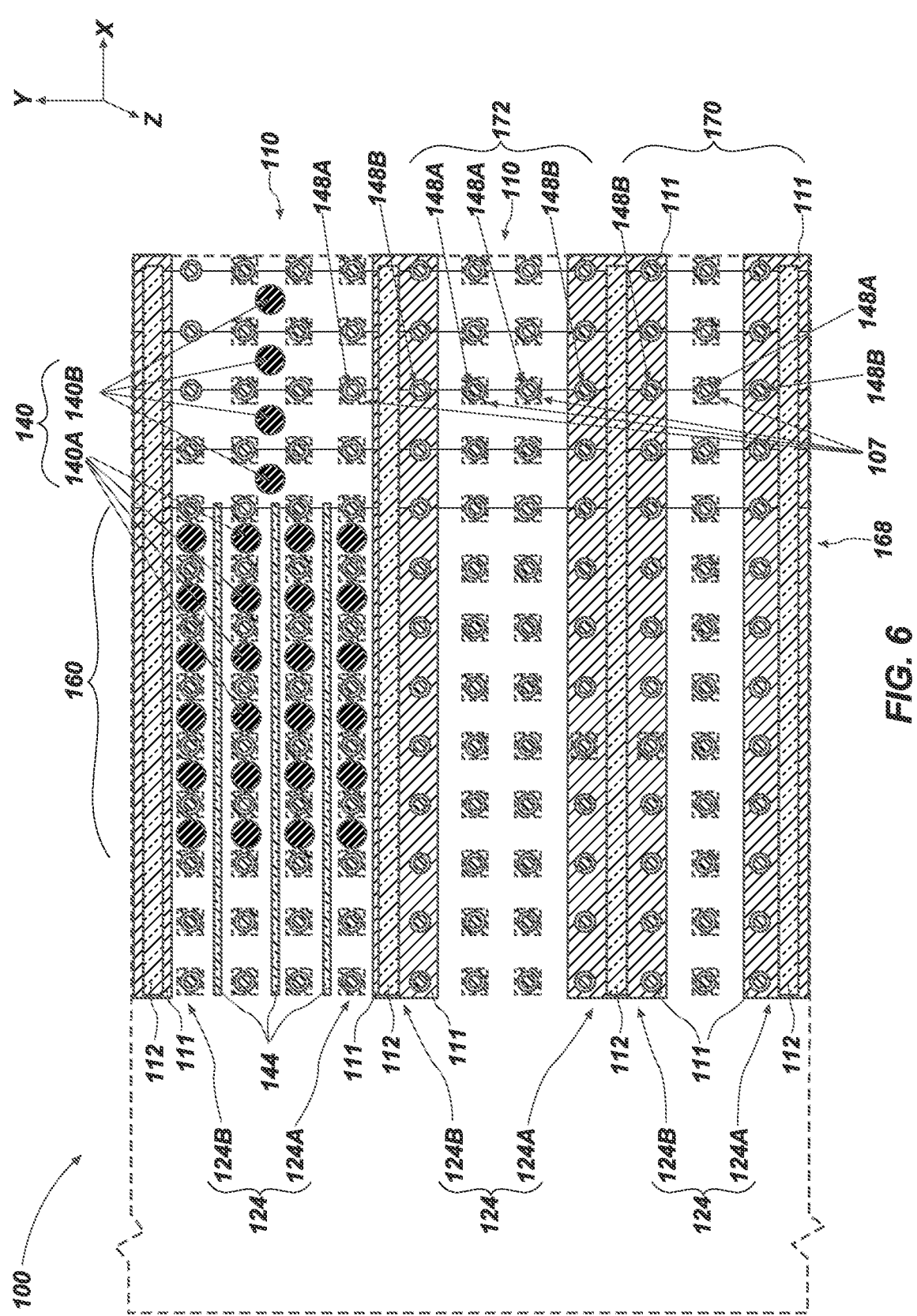
FIG. 6 is a simplified, partial top-down view of a yet further portion of the microelectronic device structure shown in FIG. 1.

FIG. 6 is a simplified, partial top-down view of the microelectronic device structure 100 proximate a die edge region 168 thereof, and with at least one die-edge transition section 170 near the die edge region 168 in the first direction (Y-direction). For clarity and ease of understanding the drawings and related description, some features (e.g., portions of the stack structure 102 (FIG. 1), the third dielectric material 130 (FIG. 1)) of the microelectronic device structure 100 vertically overlying features (e.g., discrete conductive structures 107, merged conductive structures 111 (second conductive structures 111)) the source tier 103 (FIG. 1) are omitted from FIG. 6.

As shown in FIG. 6, the die-edge transition section 170 may exhibit different patterns of the discrete conductive structures 107, the merged conductive structures 111, and the contact structures 148 (including the first contact structures 148A and the second contact structures 148B) than other sections of the microelectronic device structure 100 previously described herein. For example, the die-edge transition section 170 may include relatively fewer discrete conductive structures 107 interposed between horizontally neighboring merged conductive structures 111 as compared to other sections of the microelectronic device structure 100. In some embodiments, as depicted in FIG. 6, the die-edge transition section 170 includes a single (e.g., only one) row of the discrete conductive structures 107 horizontally interposed (e.g., in the Y-direction) between two (2) of the merged conductive structures 111. Accordingly, within the die-edge transition section 170, columns of the contact structures 148 may individually include fewer contact structures 148 (e.g., fewer first contact structures 148A) than columns of the contact structures 148 outside of the die-edge transition section 170. For example, within the die-edge transition section 170, columns of the contact structures 148 may individually include one (1) of the first contact structures 148A between two (2) of the second contact structures 148B.

Still referring to FIG. 6, a die-edge-adjacent transition section 172 may be horizontally interposed between the die-edge transition section 170 and one or more of the blocks 110 of the microelectronic device structure 100 previously described herein. The die-edge-adjacent transition section 172 be horizontally interposed (e.g., in the Y-direction) between two (2) filled slot structures 112 of the microelectronic device structure 100. The die-edge-adjacent transition section 172 may include a relatively greater quantity of the discrete conductive structures 107 interposed between horizontally neighboring merged conductive structures 111 as compared to the die-edge transition section 170. For example, the die-edge-adjacent transition section 172 may include relatively more discrete conductive structures 107 interposed between horizontally neighboring merged conductive structures 111 as compared to the die-edge transition section 170. In some embodiments, as shown in FIG. 6, the die-edge-adjacent transition section 172 includes two (2) rows of the discrete conductive structures 107 horizontally interposed (e.g., in the Y-direction) between two (2) of the merged conductive structures 111. Accordingly, within the die-edge-adjacent transition section 172, columns of the contact structures 148 may individually include more contact structures 148 (e.g., more first contact structures 148A) than columns of the contact structures 148 within the die-edge transition section 170. For example, within the die-edge-adjacent transition section 172, columns of the contact structures 148 may individually include two (2) of the first contact structures 148A between two (2) of the second contact structures 148B.

Figure 7:
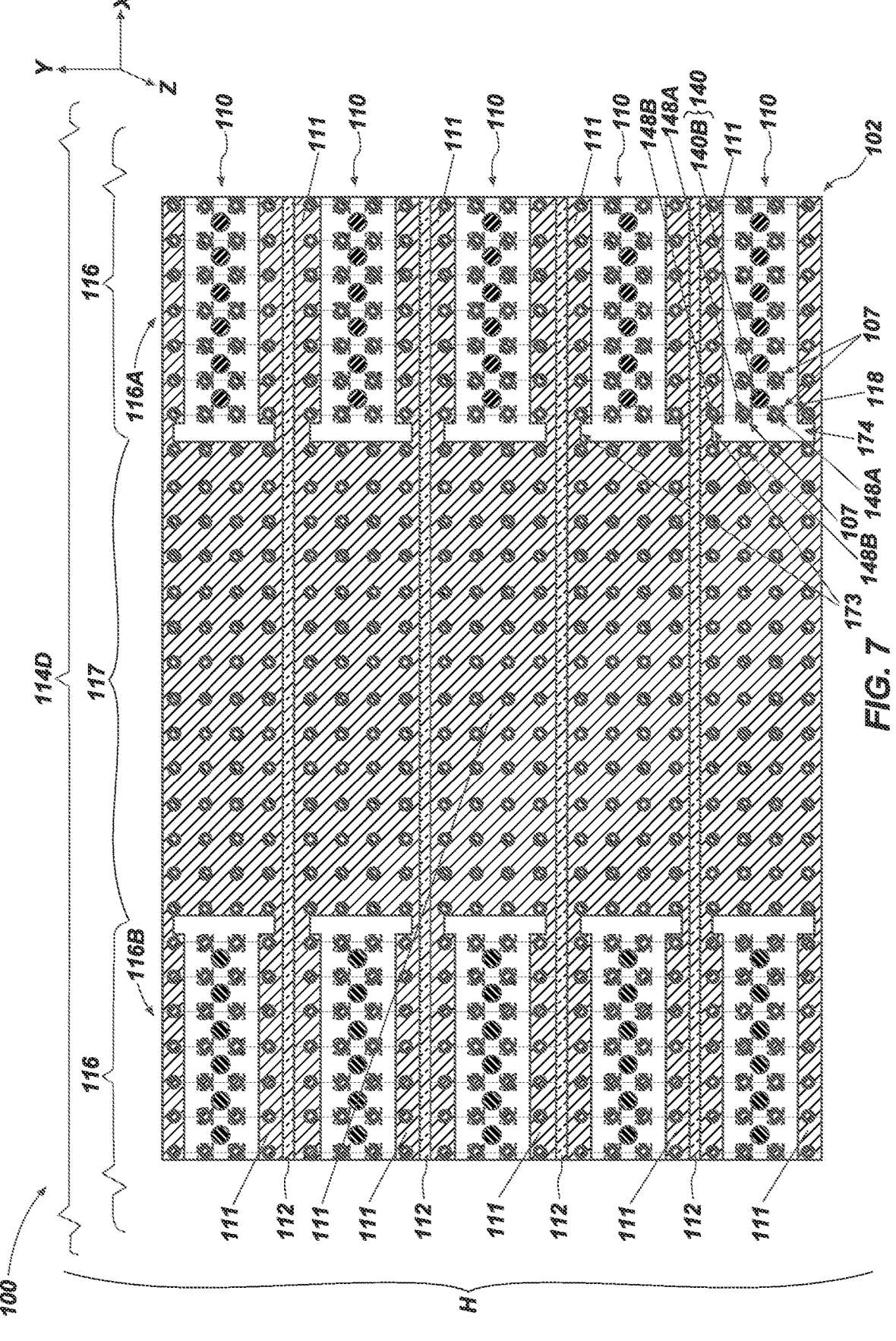
FIG. 7 is a simplified, partial top-down view of another portion of the microelectronic device structure shown in FIG. 1.

FIG. 7 is a simplified, partial top-down view of another portion H of the microelectronic device structure 100 shown in FIG. 1. For clarity and ease of understanding the drawings and related description, some features (e.g., portions of the stack structure 102 (FIG. 1), the third dielectric material 130 (FIG. 1)) of the microelectronic device structure 100 vertically overlying features (e.g., discrete conductive structures 107, merged conductive structures 111) the source tier 103 (FIG. 1) are omitted from FIG. 7. As shown in FIG. 7, for an individual block 110 of the stack structure 102 (FIG. 1), the another portion H encompasses a relatively vertically deepest stadium structure 114 within the block 110, such as the fourth stadium structure 114D shown in FIG. 1.

As depicted in FIG. 7, for an individual block 110, within a horizontal area of the central region 117 of the relatively vertically deepest stadium structure 114 (e.g., the fourth stadium structure 114D), the source tier 103 (FIG. 1) includes a central conductive structure 171. For an individual block 110, the central conductive structure 171 may be in contact (e.g., physical contact, electrical contact) with at least some of the second contact structures 148B within the a horizontal area of the central region 117 of the relatively vertically deepest stadium structure 114 (e.g., the fourth stadium structure 114D). In addition, the central conductive structure 171 may be integral and continuous with the merged conductive structures 111 by way of conductive neck structures 173 continuously horizontally extending from the central conductive structure 171 and to the merged conductive structures 111. Accordingly, the central conductive structure 171, the neck structures 173, and the merged conductive structures 111 may together form a substantially monolithic (e.g., unitary) conductive structure within the source tier 103 (FIG. 1). The monolithic conductive structure may, for example, be in electrical communication with a source structure within the source tier 103 (FIG. 1). In some embodiments, the monolithic conductive structure formed by the central conductive structure 171, the neck structures 173, and the merged conductive structures 111 is integral and continuous with a source structure (e.g., a source plate) of the source tier 103 (FIG. 1). In additional embodiments, all of the central conductive structure 171, the neck structures 173, and the merged conductive structures 111 underlying the stack structure 102 (FIG. 1) (including underlying all of the blocks 110 thereof, and as well as underlying all of the filled slot structures 112 horizontally interposed between the blocks 110) are integral and continuous with one another, so as to together form monolithic conductive structure underlying the stack structure 102 (FIG. 1). In some such embodiments, the monolithic conductive structure is integral and continuous with a source structure (e.g., a source plate) of the source tier 103 (FIG. 1).

As shown in FIG. 7, neck structures 173 within the source tier 103 (FIG. 1) may exhibit reduced horizontal dimensions in the Y-direction relative to the merged conductive structures 111. The neck structures 173 may at least partially define pullback regions 174 at transitions between the central region 117 of an individual vertically deepest stadium structure 114 (e.g., the fourth stadium structure 114D) and each of the staircase structures 116 of the vertically deepest stadium structure 114. Whereas second contact structure 148B in contact with the central conductive structure 171 may be electrically active, the first contact structures 148A in contact with the discrete conductive structures 107 may not be electrically active. Thus, the pullback regions 174 may define breaks between the central conductive structures 171 and the discrete conductive structures 107 most proximate thereto to ensure desired electrical properties within the microelectronic device structure 100.

Figure 8:
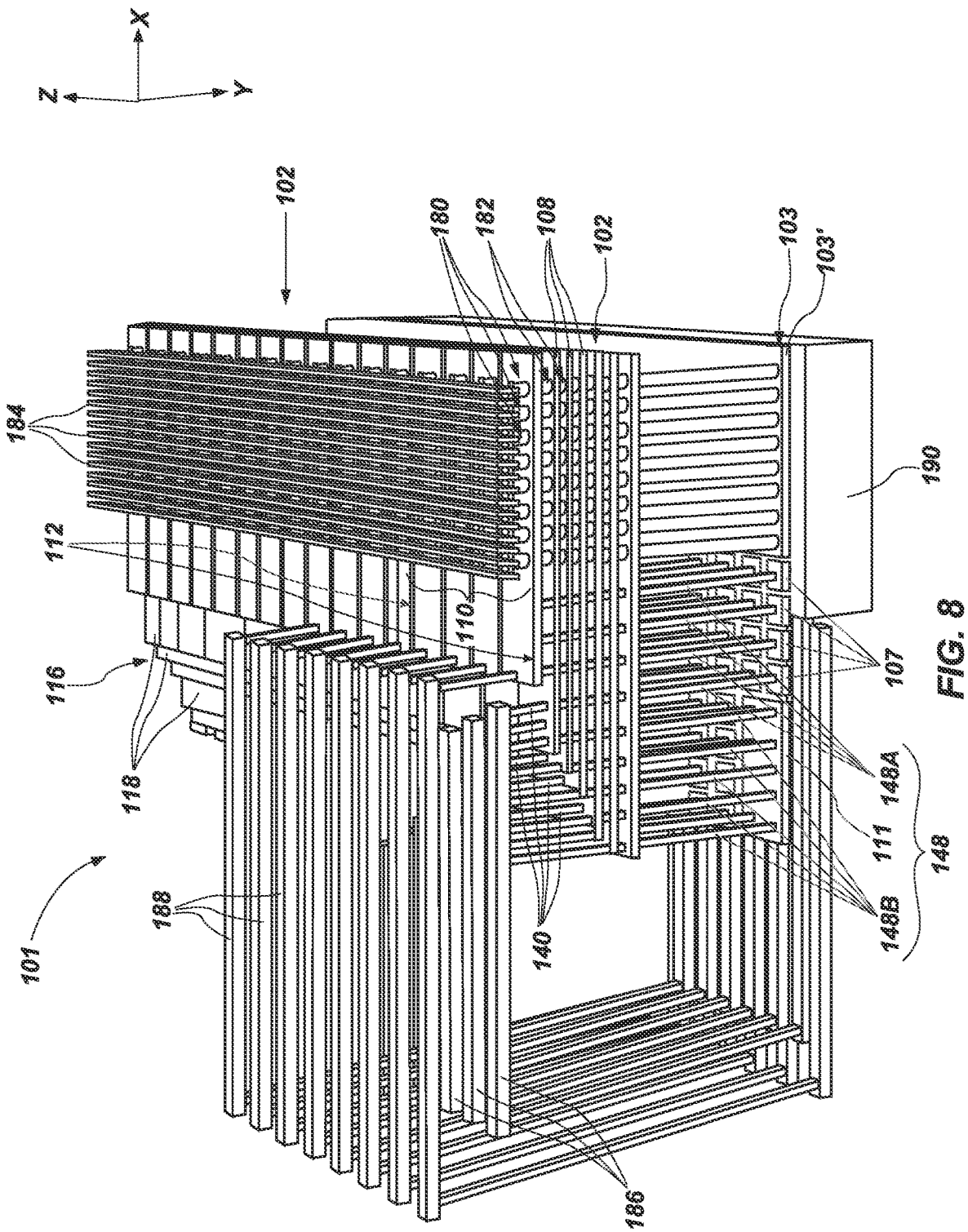
FIG. 8 illustrates a partial cutaway perspective view of a portion of a microelectronic device, according to embodiments of disclosure.

FIG. 8 illustrates a partial cutaway perspective view of a portion of a microelectronic device 101 (e.g., a memory device, such as a 3D NAND Flash memory device) that may be part of an integrated circuit. The microelectronic device 101 includes the microelectronic device structure 100 previously described with reference to FIGS. 1 through 7. For example, the microelectronic device structure 100 of the microelectronic device 101 includes the stack structure 102 includes, without limitation, the blocks 110 separated by the filled slot structures 112; the source tier 103 underlying the stack structure 102 and including the discrete conductive structures 107 and the merged conductive structures 111 (second conductive structures 111); the contact structures 148 (including the first contact structures 148A and the second contact structures 148B) in contact with the respective discrete conductive structures 107 and the merged conductive structures 111 (second conductive structures 111); and the additional contact structures 140 in contact with the steps 118 of the staircase structures 116 of the stadium structures 114.

As shown in FIG. 8, the microelectronic device 101 may further include strings 180 of memory cells 182 vertically coupled to each other in series, data lines 184 (e.g., bit lines), access lines 186, and select lines 188. The strings 180 of the memory cells 182 extend vertically and orthogonal to conductive lines and tiers (e.g., the data lines 184, the source tier 103, the tiers 108 of the stack structure 102, the access lines 186, the select lines 188) of the microelectronic device 101, and the conductive additional contact structures 140 may electrically couple components to each other as shown (e.g., the access lines 186 and the select lines 188 to the tiers 108 of the stack structure 102 of the microelectronic device structure 100). In addition, the microelectronic device 101 may also include additional structures and features under the microelectronic device structure 100, such as an additional microelectronic device structure (e.g., a lower deck structure, a forward-with reverse staircase structure, a non SGD region, a crest region, a lowest floor region, a die-edge region, an SGD region) having structures and features similar to (e.g., at least performing similar functions to) those of the microelectronic device structure 100 (e.g., additional merged conductive structures of the source tier, an additional stack structure including additional tiers of additional conductive structures and additional insulating structures, an additional staircase structure having additional steps defined by edges of the additional tiers, additional conductive contact structures electrically connected to the additional steps of the additional staircase structure, an additional source tier vertically underlying the additional staircase structure and at least including an additional source structure, and additional support contact structures vertically extending through the additional stack structure at least to the additional source structure), additional strings of memory cells, and additional lines (e.g., additional access lines, additional select lines, additional data lines) electrically connecting the additional structures and features.

With continued reference to FIG. 8, the microelectronic device 101 may also include a control unit 190 (e.g., a control device) positioned vertically below the strings 180 of memory cells 182, which may include one or more of string driver circuitry, pass gates, circuitry for selecting gates, circuitry for selecting conductive lines (e.g., the data lines 184, the access lines 186, the select lines 188, additional data lines, additional access lines, additional select lines), circuitry for amplifying signals, and circuitry for sensing signals. The control unit 190 may, for example, be electrically coupled to the data lines 184, the source structure 103' of the source tier 103, the access lines 186, and select lines 188. In some embodiments, the control unit 190 includes CMOS (complementary metal-oxide-semiconductor) circuitry. In such embodiments, the control unit 190 may be characterized as having a "CMOS under Array" ("CuA") configuration.

Thus, in accordance with embodiments of this disclosure, a stack structure comprising a vertically alternating sequence of conductive material and insulative material arranged in tiers, each of the tiers individually comprising some of the conductive material vertically neighboring some of the insulative material, and the stack structure divided into blocks separated from one another by dielectric-filled slot structures; a source tier underlying the stack structure and comprising: first conductive structures confined within horizontal areas of the blocks; second conductive structures horizontally overlapping the dielectric-filled slot structures and the blocks, the first conductive structures having smaller horizontal dimensions than the second conductive structures and horizontally interposed between horizontally neighboring pairs of the second conductive structures; first conductive contact structures vertically extending through the stack structure and to the first conductive structures; and second conductive contact structures vertically extending through the stack structure and to the second conductive structures.

Furthermore, in accordance with embodiments of this disclosure, a memory device, comprising a stack structure comprising tiers each comprising a conductive structure vertically neighboring an insulative structure, the stack structure divided into blocks separated from one another by dielectric-filled slot structures; stadium structures within the blocks of the stack structure and individually comprising staircase structures having steps comprising horizontal ends of the tiers; crest regions within the blocks and extending between neighboring pairs of the staircase structures in a first horizontal direction; bridge regions within the blocks and extending between the staircase structures and the dielectric-filled slot structures in a second horizontal direction orthogonal to the first horizontal direction; a source tier underlying the stack structure and comprising: first conductive structures confined within horizontal areas of the blocks; second conductive structures vertically underlying and within horizontal area of the bridge regions of the blocks and the dielectric-filled slot structures, the second conductive structures continuously extending from and between the crest regions of the blocks in the second horizontal direction, and the first conductive structures interposed between the second conductive structures in the first horizontal direction, the first conductive structures electrically isolated from the second conductive structures; third conductive structures within horizontal areas of the crest regions of the blocks and in electrical communication with the second conductive structures; conductive contact structures vertically extending through the blocks of the stack structure and to the first conductive structures, the second conductive structures, and the third conductive structures of the source tier; and strings of memory cells vertically extending through the blocks of the stack structure.

Moreover, in accordance with embodiments of this disclosure, a 3D NAND Flash memory device comprises: a stack structure comprising conductive structures and insulating structures vertically alternating with the conductive structures, the stack structure partitioned into blocks separated from one another by filled slot structures; staircase structures within the blocks and having steps comprising horizontal ends of the conductive structures of the stack structure; conductive contact structures on at least some of the steps of at least some of the staircase structures; a source tier structure underlying the stack structure and comprising: first conductive structures confined within horizontal areas of the blocks; second conductive structures individually overlapping the filled slot structures and neighboring pairs of the blocks of the stack structure in a first horizontal direction, the conductive contact structures continuously extending across the staircase structures in a second horizontal direction orthogonal to the first horizontal direction, the first conductive structures horizontally interposed between the second conductive structures in the first horizontal direction, the first conductive structures electrically isolated from the second conductive structures; and a source structure of the source tier and electrically isolated from the second conductive structures; first contact structures vertically extending through the blocks and physically contacting the first conductive structures; second contact structures vertically extending through the blocks and physically contacting the second conductive structures; data lines overlying the stack structure; strings of memory cells vertically extending through the blocks of the stack structure and coupled to the source structure and the data lines; additional conductive lines coupled to the conductive contact structures; and a control device vertically underlying the source tier and coupled to the source structure the data lines, and the additional conductive lines.

Figure 9:
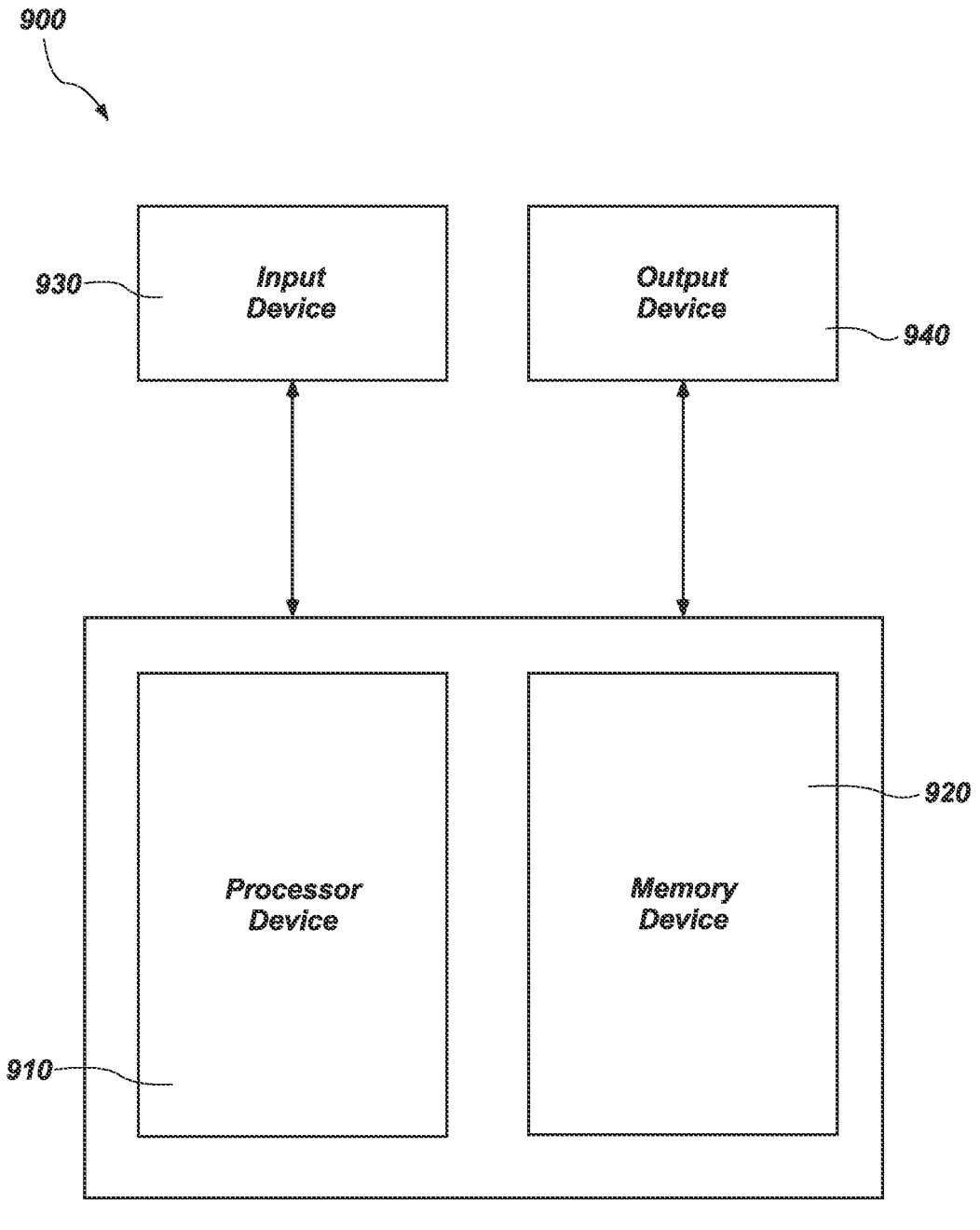
FIG. 9 is a block diagram of an electronic system, according to embodiments of disclosure.

Microelectronic device structures (e.g., the microelectronic device structure 100) and microelectronic devices (e.g., the microelectronic device 101) of the disclosure may be used in embodiments of electronic systems of the disclosure. For example, FIG. 9 is a block diagram of an electronic system 900, according to embodiments of disclosure. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc. The electronic system 900 includes at least one memory device 920. The memory device 920 may include, for example, one or more of microelectronic device structures (e.g., the microelectronic device structure 100) and a microelectronic devices (e.g., the microelectronic device 101) of the disclosure. The electronic system 900 may further include at least one electronic signal processor device 910 (often referred to as a "microprocessor") that is part of an integrated circuit. The electronic signal processor device 910 may include, for example, one or more of microelectronic device structures (e.g., the microelectronic device structure 100) and a microelectronic devices (e.g., the microelectronic device 101) of the disclosure. While the memory device 920 and the electronic signal processor device 910 are depicted as two (2) separate devices in FIG. 9, in additional embodiments, a single (e.g., only one) memory/processor device having the functionalities of the memory device 920 and the electronic signal processor device 910 is included in the electronic system 900. In such embodiments, the memory/processor device may include, for example, one or more of microelectronic device structures (e.g., the microelectronic device structure 100) and a microelectronic devices (e.g., the microelectronic device 101) of the disclosure. The electronic signal processor device 910 and the memory device 920 may be part of a disaggregated-die assembly 910 and 920.

The electronic system 900 may further include one or more input devices 930 for inputting information into the electronic system 900 by a user, such as, for example, a mouse or other pointing device, a keyboard, a touchpad, a button, or a control panel. The electronic system 900 may further include one or more output devices 940 for outputting information (e.g., visual or audio output) to a user such as, for example, a monitor, a display, a printer, an audio output jack, and/or a speaker. In some embodiments, the input device 930 and the output device 940 may comprise a single touchscreen device that can be used both to input information to the electronic system 900 and to output visual information to a user. The input device 930 and the output device 940 may communicate electrically with one or more of the memory device 920 and the electronic signal processor device 910.

Thus, in accordance with embodiments of this disclosure, an electronic system comprises: an input device; an output device; a processor device operably coupled to the input device and the output device; and a memory device operably coupled to the processor device and comprising at least one microelectronic device structure comprising: a stack structure comprising vertically alternating conductive structures and insulating structures arranged in tiers, each of the tiers individually comprising one of the conductive structures and one of the insulating structures, the stack structure having blocks separated from one another by first and second filled slot structures; a source tier structure underlying the stack structure and comprising: first and second merged conductive structures, wherein the first merged conductive structure is adjacent a first discrete conductive structure in a first direction; a second discrete conductive structure that is spaced apart from the first merged conductive structure in the first direction by the first discrete conductive structure; a first support contact structure on the first discrete conductive structure; a subsequent support contact structure on the first merged conductive structure and adjacent the first support contact structure in the first direction, wherein the first filled slot structure is vertically directly above at least a portion of the merged conductive structure; a second support contact structure on the second discrete conductive structure; the second merged conductive structure adjacent the second discrete conductive structure in the first direction, wherein the second filled slot structure is vertically directly above at least a portion of the second merged conductive structure; and a second subsequent support contact structure on the second merged conductive structure adjacent spaced apart from the second support contact structure in the first direction.

The structures (e.g., the microelectronic device structures 100), devices (e.g., the microelectronic device 101), and systems (e.g., the electronic system 900) of the disclosure advantageously facilitate one or more of improved performance, reliability, and durability, lower costs, increased miniaturization of components, improved pattern quality, and greater packaging density as compared to conventional structures, conventional devices. For example, the merged conductive structures of the disclosure (e.g., the merged conductive structures 111) mitigate fall-off of additional features (e.g., the filled slot structures 112, the second contact structures 148B) of the disclosure during formation of the additional features; alleviate undesirable lift-off of further features (e.g., the stack structure 102) of a microelectronic device of the disclosure during the formation of the microelectronic device, and prevent desirable damage (e.g., corrosion-based damage resulting from material removal processes) further features (e.g., conductive routing tortures within the conductive routing tier 105) underlying the merged conductive structures during formation of yet still further features (e.g., openings for the filled slot structures 112 and the contact structures 148) of the disclosure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising a vertically alternating sequence of conductive material and insulative material arranged in tiers, each of the tiers individually comprising some of the conductive material vertically neighboring some of the insulative material, and the stack structure divided into blocks separated from one another by dielectric-filled slot structures;
a source tier underlying the stack structure and comprising:
    first conductive structures confined within horizontal areas of the blocks; and
    second conductive structures individually horizontally overlapping a respective one of the dielectric-filled slot structures and portions of two of the blocks horizontally neighboring one another, the first conductive structures having smaller horizontal dimensions than the second conductive structures and horizontally interposed between horizontally neighboring pairs of the second conductive structures;
first conductive contact structures vertically extending through the stack structure and to the first conductive structures; and second conductive contact structures vertically extending through the stack structure and to the second conductive structures.

2. The microelectronic device of claim 1, wherein the source tier further comprises a conductive source structure within a horizonal area of a respective one of the blocks and coupled to strings of memory cells vertically extending through the respective one of the blocks.

3. The microelectronic device of claim 2, wherein the first conductive structures within the horizonal area of the respective one of the blocks are electrically isolated from the conductive source structure.

4. The microelectronic device of claim 1, further comprising:
staircase structures within the blocks of the stack structure and individually having steps comprising edges of at least some of the tiers of the stack structure; and
contact structures individually on a corresponding one of the steps of a respective one of the staircase structures, the contact structures individually horizontally interposed between at least two of the first conductive contact structures.

5. The microelectronic device of claim 4, wherein some of the contact structures are individually horizontally interposed between four of the first conductive contact structures.

6. The microelectronic device of claim 1, further comprising:
staircase structures within the blocks of the stack structure, each of the staircase structures having steps comprising horizontal ends of at least some of the tiers of the stack structure;
crest regions within the blocks of the stack structure, a respective one of the crest regions within a respective one of the blocks and horizontally interposed between two of the staircase structures horizontally neighboring one another within the respective one of the blocks; and
bridge regions within the blocks of the stack structure, a respective one of the bridge regions within the respective one of the blocks horizontally interposed between a respective one of the staircase structures within the respective one of the blocks and a corresponding one of the dielectric-filled slot structures, the respective one of the bridge regions horizontally extending from and between the two of crest regions horizontally neighboring one another.

7. The microelectronic device of claim 6, wherein at least some of the second conductive contact structures are positioned within horizontal boundaries of the bridge regions and vertically extend through the bridge regions.

8. The microelectronic device of claim 6, wherein a respective one of the second conductive structures horizontally overlaps a corresponding one of the bridge regions.

9. The microelectronic device of claim 1, wherein the source tier further comprises third conductive structures within the horizontal areas of the blocks, a respective one of the third conductive structures electrically isolated from the first conductive structures and horizontally extending from and between a respective two of the second conductive structures horizontally neighboring one another.

10. The microelectronic device of claim 9, further comprising third conductive contact structures vertically extending through the stack structure and to the third conductive structures.

* * * * *